US012363899B2

(12) United States Patent
Son et al.

(10) Patent No.: US 12,363,899 B2
(45) Date of Patent: Jul. 15, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Yonghoon Son, Yongin-si (KR); Junhyoung Kim, Seoul (KR); Joonsung Lim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 606 days.

(21) Appl. No.: 17/743,738

(22) Filed: May 13, 2022

(65) Prior Publication Data

US 2022/0399369 A1    Dec. 15, 2022

(30) Foreign Application Priority Data

Jun. 10, 2021    (KR) .......................... 10-2021-0075531

(51) Int. Cl.
*H10B 43/27*    (2023.01)
*H01L 23/522*   (2006.01)
*H01L 23/528*   (2006.01)
*H10B 41/10*    (2023.01)
*H10B 41/27*    (2023.01)
(Continued)

(52) U.S. Cl.
CPC .......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 41/40* (2023.02);
(Continued)

(58) Field of Classification Search
CPC ........ H10B 43/27; H10B 41/10; H10B 41/27; H10B 41/35; H10B 41/40; H10B 43/10; H10B 43/35; H10B 43/40; H10B 41/50; H10B 43/50; H10B 41/20; H10B 43/20; H01L 23/5226; H01L 23/5283; H01L 21/76805; H01L 21/76816;
(Continued)

(56) References Cited

U.S. PATENT DOCUMENTS 5,177,438 A       1/1993  Littlebury et al.
9,853,038 B1 *  12/2017  Cui .................... H10B 43/35
(Continued)

FOREIGN PATENT DOCUMENTS

KR    20190122372 A    10/2019
KR    20200127650 A    11/2020
KR    20200145919 A    12/2020

*Primary Examiner* — Jonathan Han
(74) *Attorney, Agent, or Firm* — Myers Bigel, P.A.

(57) ABSTRACT

A semiconductor device includes a substrate having a first region and a second region, gate electrodes stacked and spaced apart from each other in a first direction perpendicular to an upper surface of the second substrate, and extending by different lengths in a second direction on the second region to have pad regions in which upper surfaces thereof are exposed, channel structures penetrating the gate electrodes, extending in the first direction, and respectively including a channel layer, on the first region, contact plugs penetrating the pad regions of the gate electrodes and extending in the first direction, and contact insulating layers surrounding the contact plugs. The gate electrodes have side surfaces protruding further toward the contact plugs in the pad regions than ones of the gate electrodes therebelow.

20 Claims, 28 Drawing Sheets

(51) Int. Cl.
*H10B 41/35* (2023.01)
*H10B 41/40* (2023.01)
*H10B 43/10* (2023.01)
*H10B 43/35* (2023.01)
*H10B 43/40* (2023.01)

(52) U.S. Cl.
CPC ............ *H10B 43/10* (2023.02); *H10B 43/35* (2023.02); *H10B 43/40* (2023.02)

(58) Field of Classification Search
CPC ............ H01L 21/76831; H01L 23/481; H01L 25/0657; H01L 2225/06544; H10D 84/0149
See application file for complete search history.

(56) References Cited

U.S. PATENT DOCUMENTS

| | | |
|---|---|---|
| 9,911,692 B2 | 3/2018 | Smith et al. |
| 9,991,271 B2 | 6/2018 | Kang et al. |
| 10,490,569 B2 | 11/2019 | Mushiga et al. |
| 10,903,230 B2 | 1/2021 | Kaminaga et al. |
| 10,903,236 B2 | 1/2021 | Choi et al. |
| 11,672,113 B2 * | 6/2023 | Kato ...................... H10B 43/50 257/314 |
| 2015/0287710 A1 * | 10/2015 | Yun ...................... H01L 23/528 257/314 |
| 2019/0326316 A1 | 10/2019 | Son et al. |
| 2020/0350249 A1 | 11/2020 | Kim et al. |
| 2020/0402906 A1 | 12/2020 | Lim |

\* cited by examiner

SEMICONDUCTOR DEVICES AND DATA STORAGE SYSTEMS INCLUDING THE SAME

CROSS TO REFERENCE TO RELATED APPLICATION(S)

This application claims benefit of priority to Korean Patent Application No. 10-2021-0075531 filed on Jun. 10, 2021 in the Korean Intellectual Property Office, the disclosure of which is incorporated herein by reference in its entirety.

FIELD

Example embodiments of the present disclosure relate to a semiconductor device and a data storage system including the same.

BACKGROUND

There has been demand for semiconductor devices that can provide high-capacity data storage in a data storage system. Accordingly, various approaches for increasing data storage capacity of a semiconductor device have been studied. For example, in one method of increasing data storage capacity of a semiconductor device, a semiconductor device may include memory cells arranged three-dimensionally, instead of memory cells arranged two-dimensionally.

SUMMARY

An example embodiment of the present disclosure is to provide a semiconductor device having improved reliability.

An example embodiment of the present disclosure is to provide a data storage system including a semiconductor device having improved reliability.

According to an example embodiment of the present disclosure, a semiconductor device includes a first semiconductor structure comprising a first substrate, circuit devices on the first substrate, and lower interconnection lines; and a second semiconductor structure on the first semiconductor structure. The second semiconductor structure includes a second substrate comprising a first region and a second region; gate electrodes and interlayer insulating layers alternately stacked in a first direction perpendicular to an upper surface of the second substrate, the gate electrodes extending by different lengths in a second direction on the second region to provide pad regions comprising upper surfaces that are exposed by the interlayer insulating layers; channel structures penetrating the gate electrodes, extending in the first direction, and each comprising a channel layer, on the first region; respective contact plugs electrically connected to the pad regions of the gate electrodes, penetrating the gate electrodes, and extending in the first direction; and contact insulating layers surrounding the respective contact plugs. The pad regions include first and second pad portions, the first pad portions protruding further toward the respective contact plugs than ones of the gate electrodes therebelow to overlap the respective contact plugs in the first direction. The gate electrodes have a first thickness on the first region, and the second pad portions have a second thickness that is greater than the first thickness.

According to an example embodiment of the present disclosure, a semiconductor device includes a substrate comprising a first region and a second region; gate electrodes stacked and spaced apart from each other in a first direction perpendicular to an upper surface of the second substrate, and extending by different lengths in a second direction on the second region to provide pad regions comprising upper surfaces that are exposed; channel structures penetrating the gate electrodes, extending in the first direction, and each comprising a channel layer, on the first region; respective contact plugs penetrating the pad regions of the gate electrodes and extending in the first direction; and contact insulating layers surrounding the respective contact plugs. The gate electrodes include side surfaces protruding further toward the respective contact plugs in the pad regions than ones of the gate electrodes therebelow According to an example embodiment of the present disclosure, a data storage system includes a semiconductor storage device comprising a substrate comprising a first region and a second region, circuit devices on one side of the substrate, and input/output pads electrically connected to the circuit devices; and a controller electrically connected to the semiconductor storage device through the input/output pad and configured to control the semiconductor storage device. The semiconductor storage device includes gate electrodes stacked and spaced apart from each other in a first direction perpendicular to an upper surface of the substrate, and extending by different lengths in a second direction on the second region to provide pad regions comprising upper surfaces that are exposed; channel structures penetrating the gate electrodes, extending in the first direction, and each comprising a channel layer, on the first region; respective contact plugs penetrating the pad regions of the gate electrodes and extending in the first direction; and contact insulating layers surrounding the contact plugs. The gate electrodes comprise side surfaces protruding further toward the respective contact plugs in the pad regions than ones of the gate electrodes therebelow.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the accompanying drawings.

Figure 1:
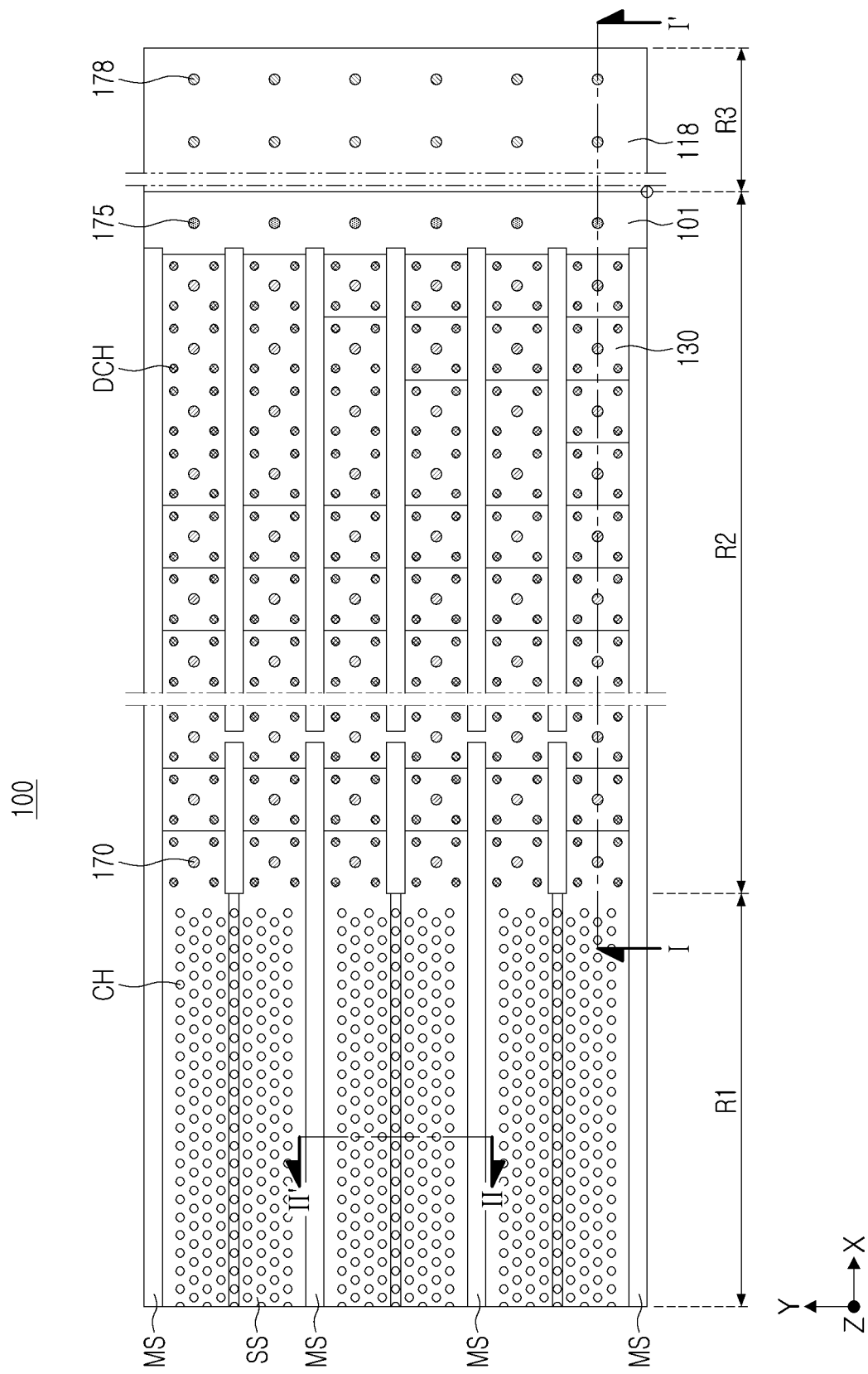
FIG. 1 is a plan view illustrating a semiconductor device according to an example embodiment of the present disclosure.

FIG. 1 is a plan view illustrating a semiconductor device according to an example embodiment.

Figure 2A:
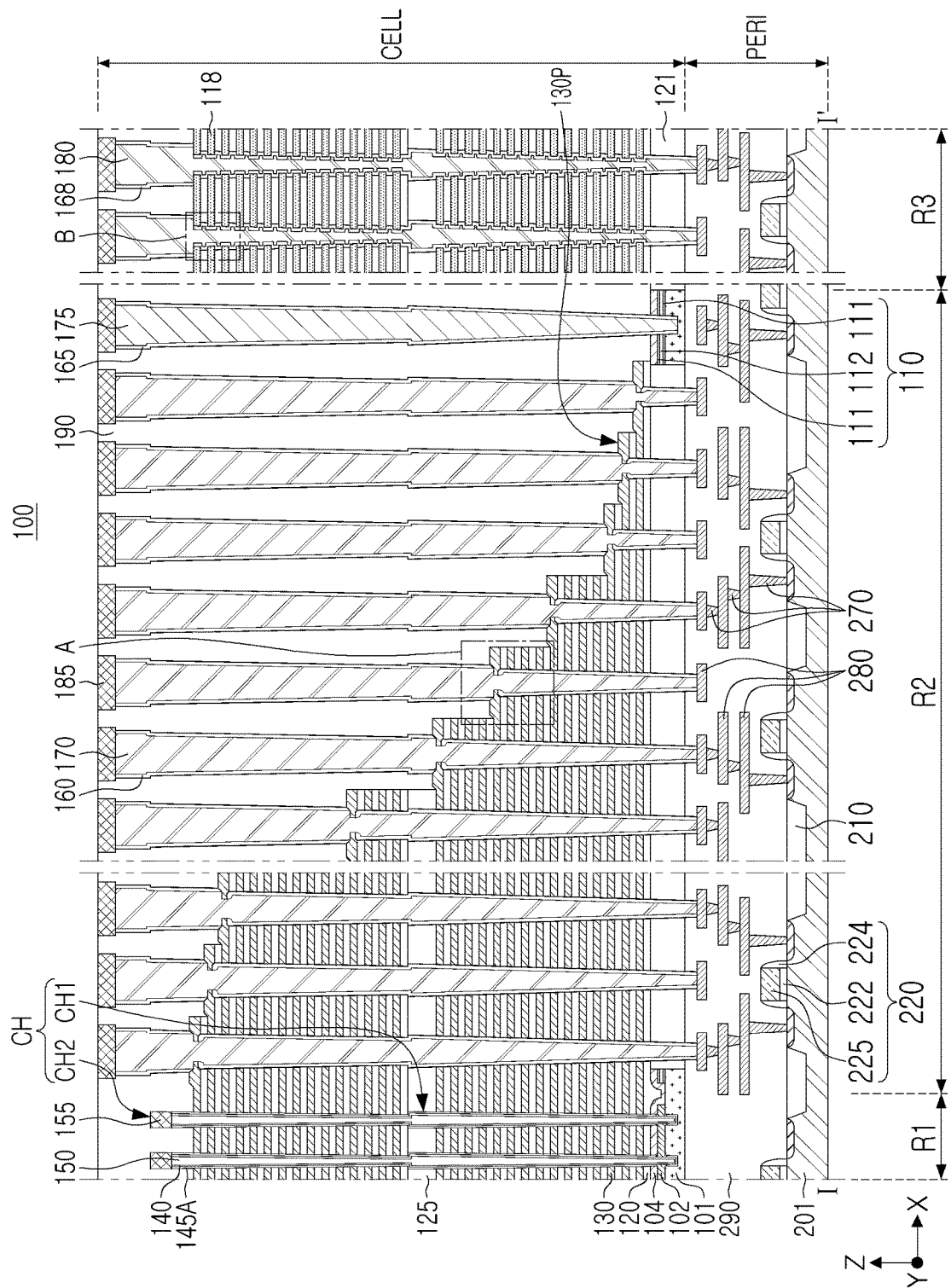
FIGS. 2A and 2B are cross-sectional views illustrating a semiconductor device according to an example embodiment of the present disclosure.
Figure 2B:
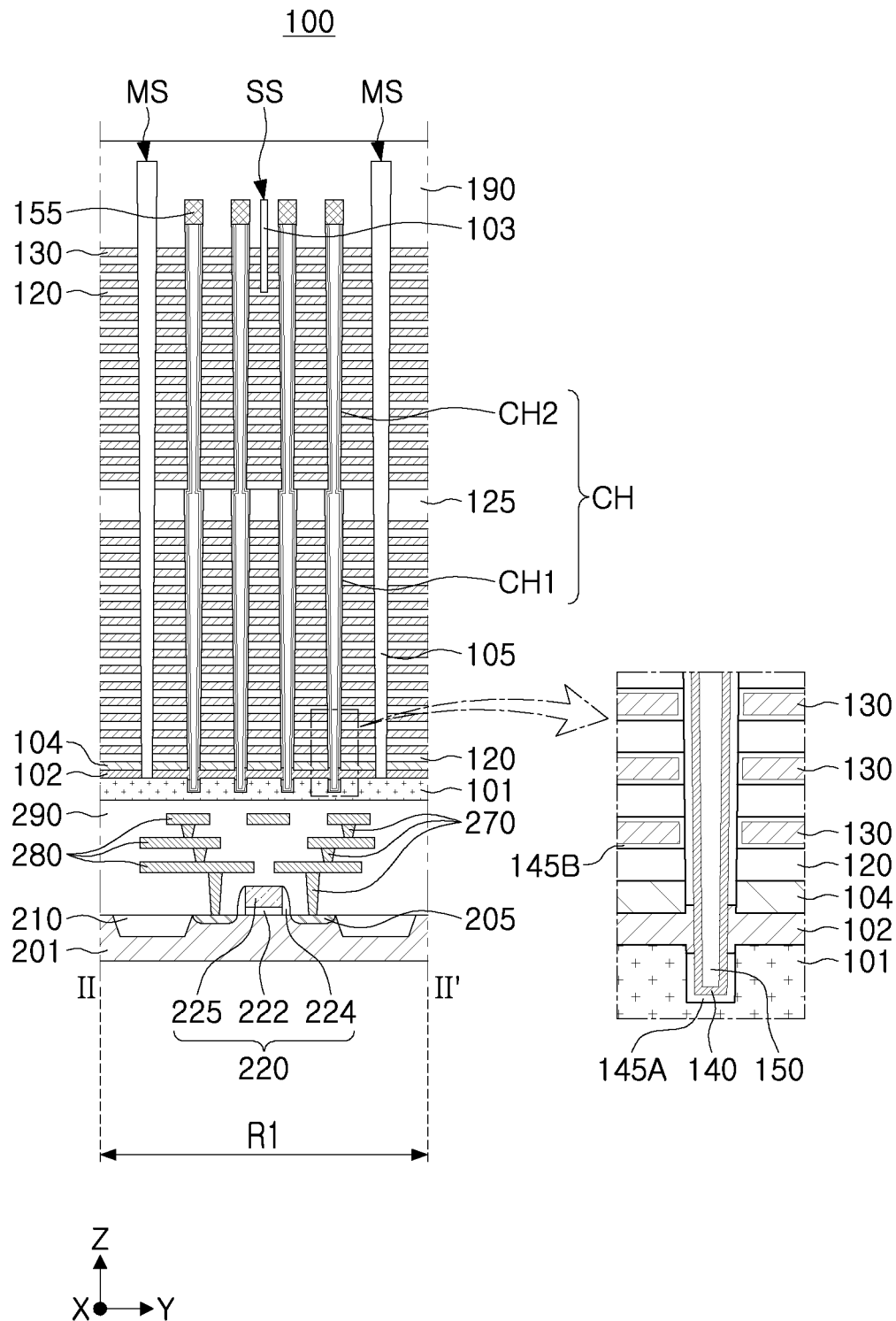

FIGS. 2A and 2B are cross-sectional views illustrating a semiconductor device according to an example embodiment. FIG. 2A is a cross-sectional view taken along line I-I' in FIG. 1, and FIG. 2B is a cross-sectional view taken along line II-II' in FIG. 1.

Figure 3A:
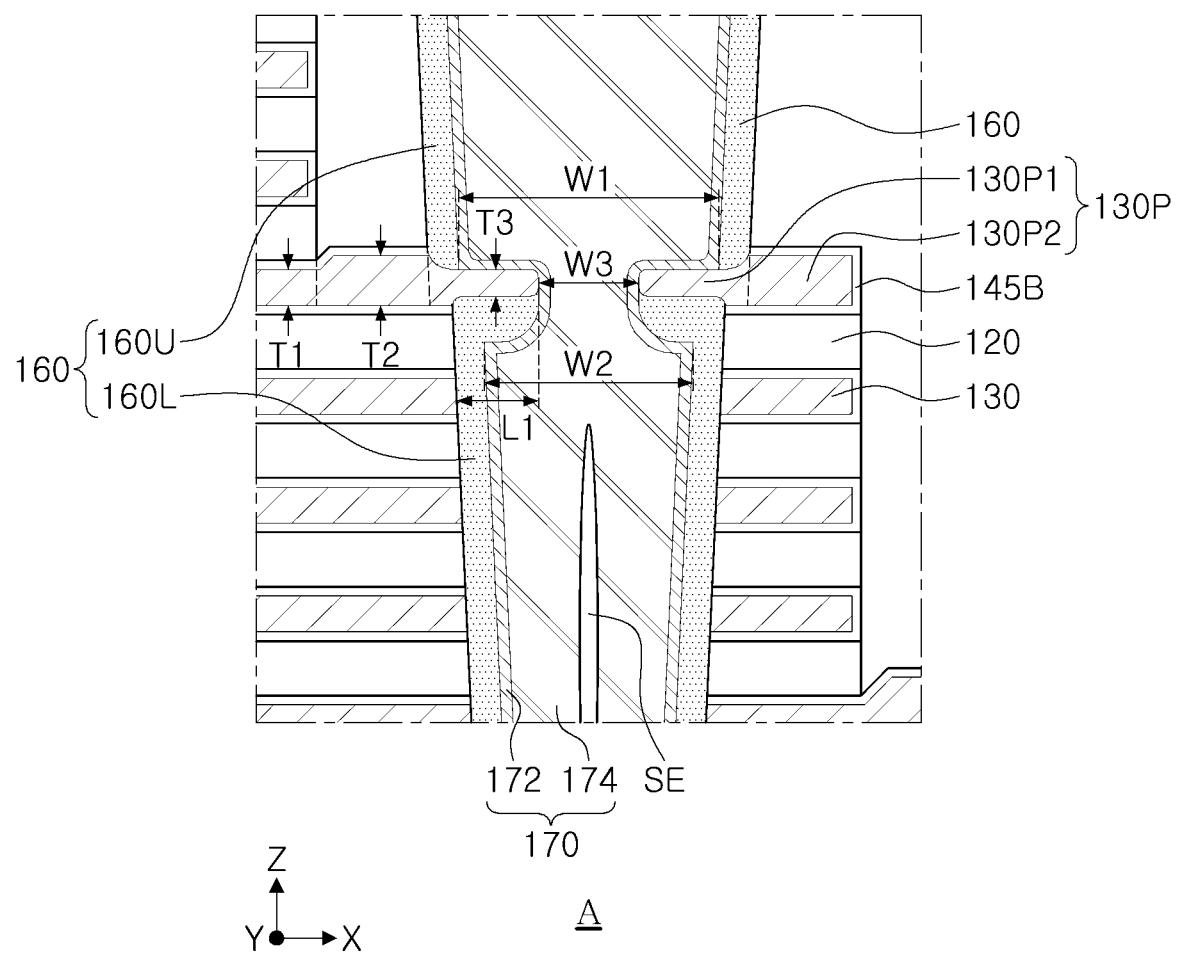
FIGS. 3A and 3B are an enlarged view and a perspective view illustrating a partial region of a semiconductor device according to an example embodiment of the present disclosure.
Figure 3B:
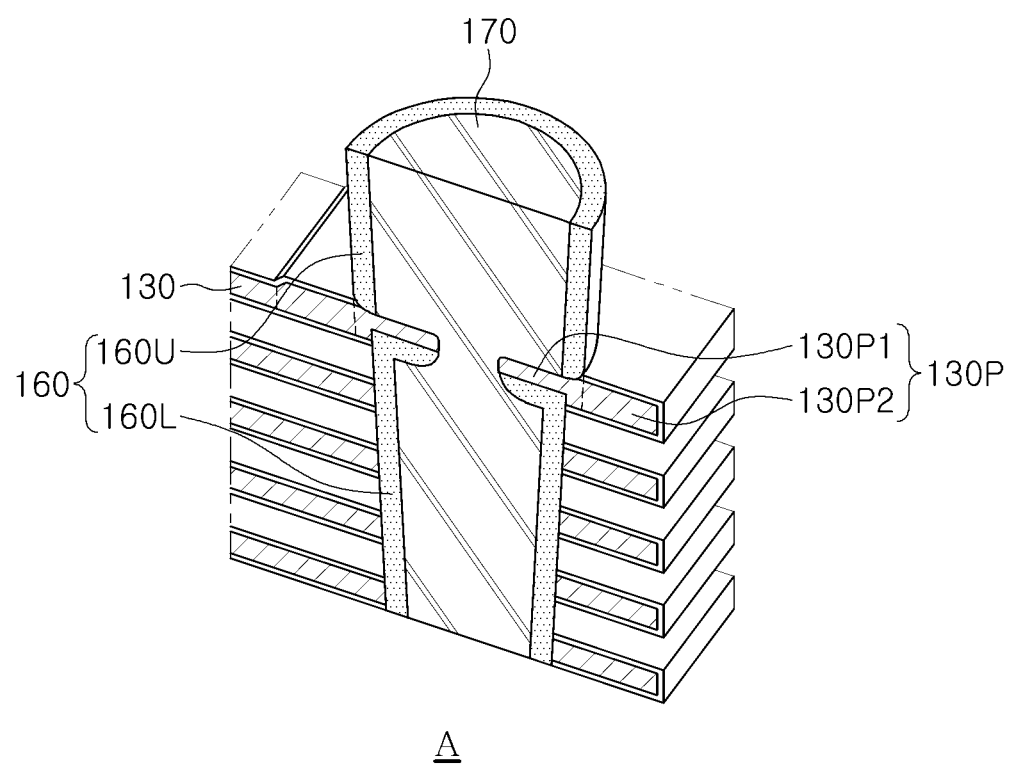

FIGS. 3A and 3B are an enlarged view and a perspective view illustrating a partial region of a semiconductor device according to an example embodiment. FIG. 3A is an enlarged view illustrating region "A" in FIG. 2A, and FIG. 3B is a perspective view illustrating region "A".

Figure 4:
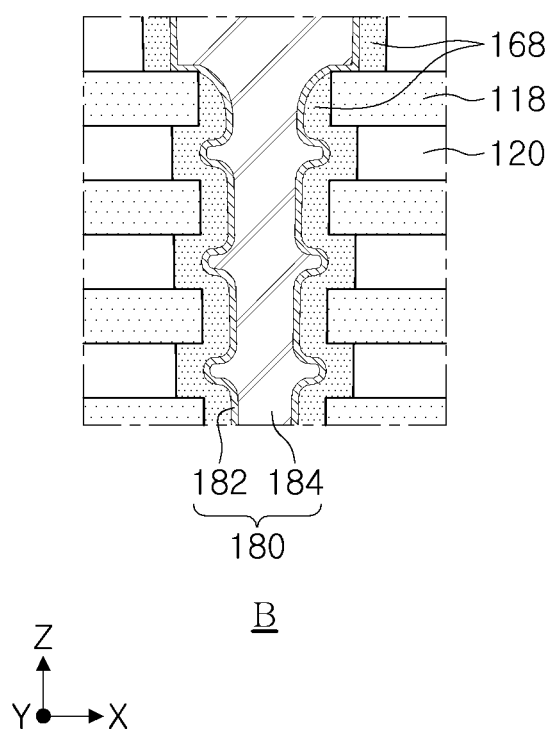
FIG. 4 is an enlarged view illustrating a partial region of a semiconductor device according to an example embodiment of the present disclosure.

FIG. 4 is an enlarged view illustrating a partial region of a semiconductor device according to an example embodiment, illustrating region "B" in FIG. 2A.

Referring to FIGS. 1 to 4, a semiconductor device 100 may include a peripheral circuit region PERI which may be a first semiconductor structure including a first substrate 201 and a memory cell region CELL which may be a second semiconductor structure including a second substrate 101. The memory cell region CELL may be disposed on the peripheral circuit region PERI. Alternatively, in example embodiments, the cell region CELL may be disposed below the peripheral circuit region PERI. Spatially relative terms such as "beneath," "below," "lower," "above," "upper," and the like, are intended to encompass different orientations of the device in use or operation in addition to the orientation depicted in the figures, with the spatially relative descriptors interpreted accordingly. For example, if the device in the figures is turned upside down, elements described as "below" or "beneath" other elements or features would then be oriented "above" the other elements or features; thus, the term "below" can encompass both an orientation of above and below.

The peripheral circuit region PERI may include a first substrate 201, source/drain regions 205 and device isolation layers 210 in the first substrate 201, circuit devices 220 disposed on the first substrate 201, circuit contact plugs 270, circuit interconnection lines 280, and a peripheral region insulating layer 290.

The first substrate 201 may have an upper surface extending in the x direction and the y direction. An active region may be defined in the first substrate 201 by the device isolation layers 210. The source/drain regions 205 including impurities may be disposed in a portion of the active region. The first substrate 201 may include a semiconductor material, such as, for example, a group IV semiconductor, a group III-V compound semiconductor, or a group II-VI compound semiconductor. The first substrate 201 may be provided as a bulk wafer or an epitaxial layer.

The circuit devices 220 may include a planar transistor. Each of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The circuit contact plugs 270 and the circuit interconnection lines 280 may form a lower interconnection structure electrically connected to the circuit devices 220 and the source/drain regions 205. The circuit contact plugs 270 may have a cylindrical shape, and the circuit interconnection lines 280 may have a linear shape. The circuit contact plugs 270 and the circuit interconnection lines 280 may include a conductive material, such as, for example, tungsten (W), copper (Cu), aluminum (Al), or the like, and each of the elements may further include a diffusion barrier. However, in example embodiments, the number of layers and the arrangement form of the circuit contact plugs 270 and the circuit interconnection lines 280 may be varied.

The peripheral region insulating layer 290 may be disposed on the first substrate 201 to cover the circuit device 220. The peripheral region insulating layer 290 may be formed of an insulating material and may include one or more insulating layers.

The memory cell region CELL may include a second substrate 101 having a first region R1 and a second region R2, gate electrodes 130 stacked on the second substrate 101, interlayer insulating layers 120 alternately stacked with the gate electrodes 130, channel structures CH disposed to penetrate the stack structure of the gate electrodes 130, separation regions MS extending by penetrating the stack structure of the gate electrodes 130, contact plugs 170 connected to the pad regions 130P of the gate electrodes 130 in the second region R2 and extending vertically, and contact insulating layers 160 surrounding the contact plugs 170. As used herein, elements that "surround" or are "surrounding" another element may or may not completely surround the other element.

The memory cell region CELL may include a substrate insulating layer 121, first and second horizontal conductive layers 102 and 104 disposed below the gate electrodes 130 on the first region R1, horizontal insulating layer 110 disposed below the gate electrodes 130 in the second region R2, upper separation regions SS penetrating a portion of the gate electrodes 130, sacrificial insulating layers 118 on an external side of the gate electrodes 130, substrate contacts 175 connected to the second substrate 101, through vias 180 penetrating the sacrificial insulating layers 118, via insulating layers 168 surrounding the through vias 180, upper interconnections 185 on the contact plugs 170, and cell region insulating layer 190 covering the gate electrodes 130.

In the first region R1 of the second substrate 101, the gate electrodes 130 may be vertically stacked and the channel structures CH may be disposed, and memory cells may be disposed in the first region R1. In the second region R2 of the second substrate 101, the gate electrodes 130 may extend by different lengths, and the second region R2 may be provided to electrically connect the memory cells to the peripheral circuit region PERI. The second region R2 may be disposed on at least one end of the first region R1 in at least one direction, the x direction, for example. The second substrate 101 may have the form of a plate layer and may function as at least a portion of a common source line of the semiconductor device 100.

The second substrate 101 may have an upper surface extending in the x direction and the y direction. The second substrate 101 may include a semiconductor material, such as, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

The first and second horizontal conductive layers 102 and 104 may be stacked in order on the upper surface of the first region R1 of the second substrate 101. The first horizontal conductive layer 102 may not extend to the second region R2 of the second substrate 101, and the second horizontal conductive layer 104 may extend to the second region R2. The first horizontal conductive layer 102 may function as a portion of the common source line of the semiconductor device 100, and may function as a common source line together with the second substrate 101, for example. As illustrated in the enlarged view in FIG. 2B, the first horizontal conductive layer 102 may be directly connected to the channel layer 140 around the channel layer 140. The second horizontal conductive layer 104 may be in contact with the second substrate 101 in regions in which the first horizontal conductive layer 102 and the horizontal insulating layer 110 are not disposed. The second horizontal conductive layer 104 may cover an end of the first horizontal conductive layer 102 or the horizontal insulating layer 110 in the regions, may be bent, and may extend to the second substrate 101.

The first and second horizontal conductive layers 102, 104 may include a semiconductor material, such as, for example, polycrystalline silicon. In this case, at least the first horizontal conductive layer 102 may be configured as a layer doped with impurities of the same conductivity-type as that of the second substrate 101, and the second horizontal conductive layer 104 may be configured as a doped layer or may include impurities diffused from the first horizontal conductive layer 102. However, the material of the second horizontal conductive layer 104 is not limited to the semiconductor material, and may be replaced with an insulating layer.

The horizontal insulating layer 110 may be disposed on the second substrate 101 in parallel to the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion of the first horizontal conductive layer 102 are replaced with the first horizontal conductive layer 102 in the process of manufacturing the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The substrate insulating layer 121 may extend in the z direction in at least a portion of the second region R2 and may be disposed to penetrate the second substrate 101, the horizontal insulating layer 110, and the second horizontal conductive layer 104. Also, the substrate insulating layer 121 may be disposed in a third region R3 of the memory cell region CELL from which the second substrate 101 is removed. The third region R3 may be, for example, an external region of the second substrate 101 or a through interconnection region disposed to be surrounded by the first region R1 or the second region R2. A lower surface of the substrate insulating layer 121 may be coplanar with a lower surface of the second substrate 101 or may be disposed on a level lower than a level of the lower surface of the second substrate 101.

In the second region R2, the substrate insulating layer 121 may be disposed to surround the contact plugs 170. The substrate insulating layer 121 may be disposed to surround the entire contact plugs 170 or each of the contact plugs 170. Electrical isolation between the contact plugs 170 electrically connected to different gate electrodes 130 may be enhanced by substrate insulating layer 121. However, in example embodiments, the substrate insulating layer 121 in the second region R2 may not be provided. In this case, the contact plugs 170 may be electrically separated from the second substrate 101 and the second horizontal conductive layer 104 by the contact insulating layers 160. The substrate insulating layer 121 may include an insulating material, such as, for example, silicon oxide, silicon nitride, silicon carbide, or silicon oxynitride.

The gate electrodes 130 may be vertically stacked and spaced apart from each other on the second substrate 101 and may form a stack structure. The gate electrodes 130 may include lower gate electrodes forming a gate of ground select transistor, memory gate electrodes forming the plurality of memory cells, and upper gate electrodes forming gates of string select transistors. The number of the memory gate electrodes included in the memory cells may be determined depending on capacity of the semiconductor device 100. In example embodiments, the number of each of the upper and lower gate electrodes may be 1 to 4 or more, and the upper and lower gate electrodes may have a structure the same as or different from that of the memory gate electrodes.

In example embodiments, the gate electrodes 130 may further include an erase gate electrode disposed above the upper gate electrodes and/or below the lower gate electrodes 130 and forming an erase transistor used in an erase operation using a gate induced drain leakage (GIDL) phenomenon. Also, a portion of the gate electrodes 130, the memory gate electrodes 130 adjacent to the upper or lower gate electrodes, may be dummy gate electrodes.

The gate electrodes 130 may be separated from each other in they direction by the separation regions MS continuously extending in the first region R1 and the second region R2. The gate electrodes 130 between the separation regions MS may form a single memory block, but an example embodiment thereof is not limited thereto. A portion of the gate electrodes 130, the memory gate electrodes, for example, may form a single layer in a single memory block.

The gate electrodes 130 may be vertically stacked and spaced apart from each other on the first region R1 and the second region R2, may extend by different lengths from the first region R1 to the second region R2, and may form a stepped structure in the form of a staircase in a portion of the second region R2. The gate electrodes 130 may also be disposed to have a stepped structure in the y direction.

By the stepped structure, the lower gate electrode 130 of the gate electrodes 130 may extend (e.g., laterally) farther than the upper gate electrode 130, such that the upper surfaces of the gate electrodes 130 may be exposed upwardly from the interlayer insulating layers 120, and each of the regions may be referred to as pad regions 130P. In each gate electrode 130, the pad region 130P may include an end extending in the x direction. The pad region 130P may be a portion of an uppermost gate electrode 130 among the gate electrodes 130 included in the stack structure in each region of the second region R2. The gate electrodes 130 may be connected to the contact plugs 170 in the pad regions 130P, respectively. The gate electrodes 130 may have an increased thickness in the pad regions 130P. The thickness of each of the gate electrodes 130 may increase such that the level of the lower surface may be constant and the level of the upper surface may increase.

As illustrated in FIGS. 3A and 3B, the gate electrodes 130 may extend from the first region R1 toward the second region R2 by a first thickness T1, and may have a second thickness T2 greater than the first thickness T1 in the pad region 130P marked by a dotted line in FIGS. 3A and 3B. For example, the second thickness T2 may be in a range of about 120% to about 180% of the first thickness T1. The second thickness T2 may be greater than a thickness of the thickest gate electrode 130 in the first region R1 among the gate electrodes 130.

The pad region 130P may include a first pad portion 130P1 having external side surfaces laterally protruding further toward the contact plug 170 than the gate electrodes 130 disposed below the first pad portion 130P1, and a second pad portion 130P2 surrounding the first pad portion 130P1. The first pad portion 130P1 may overlap the contact plug 170 and the contact insulating layer 160 in the z direction. As illustrated in FIG. 3B, the first pad portion 130P1 may surround the contact plug 170 and may protrude from the second pad portion 130P2 toward the contact plug 170 in an annular shape. The second pad portion 130P2 may be a region other than the first pad portion 130P1 in the pad region 130P, and may correspond to a region having a second thickness T2. The first pad portion 130P1 may have a third thickness T3 smaller than the second thickness T2. The third thickness T3 may be smaller than the first thickness T1, but an example embodiment thereof is not limited thereto.

An upper surface of the first pad portion 130P1 may be in contact with the contact plug 170 and the contact insulating layer 160, and an external side surface of the first pad portion 130P1 may be in contact with the contact plug 170. A lower surface of the first pad portion 130P1 may be in contact with the contact insulating layer 160 and the second gate dielectric layer 145B. The first pad portion 130P1 may have a shape in which a level of the upper surface may be lowered and a level of the lower surface may increase in a region in contact with the contact insulating layer 160 and the contact plug 170. In the example embodiment, the point at which the level of the upper surface is lowered and the point at which the level of the lower surface increases may be shifted or offset from each other in the x direction, instead of being disposed linearly in the z direction. In some example embodiments, the first pad portion 130P1 may have a shape in which the thickness thereof may gradually decrease in the protrusion direction, and the specific shape of the first pad portion 130P1 is not limited to the example illustrated in FIG. 3A.

In example embodiments, a length L1 in which the external side surface of the first pad portion 130P1 protrudes from side surfaces of the lower gate electrodes 130 may be varied. For example, the protruding length L1 may be varied in a range in which, while a diameter of the contact plug 170 is secured in a region surrounded by the first pad portion 130P1, an area of the upper surface of the first pad portion 130P1 in contact with the contact plug 170 is secured.

The gate electrodes 130 may include a metal material, such as, for example, tungsten (W). In example embodiments, the gate electrodes 130 may include polycrystalline silicon or a metal silicide material. In example embodiments, the gate electrodes 130 may further include a diffusion barrier, and the diffusion barrier may include tungsten nitride (WN), tantalum nitride (TaN), or titanium nitride (TiN), or a combination thereof, for example.

The interlayer insulating layers 120 may be disposed between the gate electrodes 130. Similarly to the gate electrodes 130, the interlayer insulating layers 120 may be disposed to be spaced apart from each other in a direction perpendicular to the upper surface of the second substrate 101 and to extend in the x direction. The interlayer insulating layers 120 may include an insulating material such as silicon oxide or silicon nitride.

The sacrificial insulating layers 118 may be disposed on the same level as a level of the gate electrodes 130 and may have the same thickness as that of the gate electrodes 130 in the third region R3, and may be disposed such that side surfaces thereof may be in contact with the gate electrodes 130 in a region not illustrated. The sacrificial insulating layers 118 may be disposed to have a width the same as or different from that of the lower substrate insulating layer 121. The sacrificial insulating layers 118 may be formed of an insulating material different from that of the interlayer insulating layers 120, and may include, for example, silicon oxide, silicon nitride, or silicon oxynitride.

The separation regions MS may be disposed to penetrate the gate electrodes 130 in the first region R1 and the second region R2 and may extend in the x direction. As illustrated in FIG. 1, the separation regions MS may be disposed parallel to each other. A portion of the separation regions MS may extend as a single region along the first region R1 and the second region R2, and the other portion may extend only to a portion of the second region R2, or may be intermittently disposed in the first region R1 and the second region R2. However, in example embodiments, the arrangement order, the arrangement gap, or the like, of the separation regions MS may be varied. As illustrated in FIG. 2B, the separation regions MS may penetrate the entire gate electrodes 130 stacked on the second substrate 101 and may be connected to the second substrate 101. A separation insulating layer 105 may be disposed in the separation regions MS.

The upper separation regions SS may extend in the x direction between the separation regions MS. The upper separation regions SS may be disposed in a portion of the second region R2 and the first region R1 to penetrate a portion of the gate electrodes 130 including the uppermost gate electrode 130 among the gate electrodes 130. As illustrated in FIG. 2B, the upper separation regions SS may separate three gate electrodes 130 from each other in the y direction, for example. However, the number of gate electrodes 130 separated by the upper separation regions SS may be varied in example embodiments. The upper separation regions SS may include an upper separation insulating layer 103.

Each of the channel structures CH may form a single memory cell string, and may be spaced apart from each other while forming rows and columns on the first region R1. The channel structures CH may be disposed to form a grid pattern on the x-y plane or may be disposed in a zigzag pattern in one direction. The channel structures CH may have a columnar shape, and may have an inclined side surface having a width decreasing toward the second substrate 101 depending on an aspect ratio. As illustrated in FIG. 1, dummy channels DCH may be disposed in the second region R2. The dummy channels DCH may also be disposed in the second region R2 and may work as a support in the process of manufacturing the semiconductor device 100, and may have a structure the same as or different from that of the channel structures CH. In example embodiments, the channel structures CH disposed adjacent to an end of the first region R1 may also be dummy channels which do not substantially form the memory cell string.

The channel structures CH may include first and second channel structures CH1 and CH2 vertically stacked. The channel structures CH may have a shape in which the lower first channel structures CH1 are connected to the upper second channel structures CH2, and may have a bent portion due to a difference in width in the connection region. However, in example embodiments, the number of channel structures stacked in the z direction may be varied.

Each of the channel structures CH may include a channel layer 140, a first gate dielectric layer 145A, a channel filling insulating layer 150, and a channel pad 155, disposed in the channel hole. As illustrated in the enlarged view in FIG. 2B, the channel layer 140 may be formed in an annular shape surrounding the channel filling insulating layer 150 disposed therein, but in example embodiments, the channel layer 140 may have a columnar shape such as a cylindrical shape or a prism shape without the channel filling insulating layer 150. The channel layer 140 may be connected to the first horizontal conductive layer 102 in a lower portion. The channel layer 140 may include a semiconductor material such as polycrystalline silicon or single crystal silicon.

The first gate dielectric layer 145A may be disposed between the gate electrodes 130 and the channel layer 140 together with the second gate dielectric layer 145B. Although not specifically illustrated, the first gate dielectric layer 145A may include a tunneling layer, a charge storage layer, and a blocking layer stacked in order from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k material, or a combination thereof.

The channel pad 155 may be disposed only on an upper end of the upper second channel structure CH2. The channel pad 155 may include, for example, doped polycrystalline silicon.

The channel layer 140, the first gate dielectric layer 145A, and the channel filling insulating layer 150 may be connected to each other between the first channel structure CH1 and the second channel structure CH2. An upper interlayer insulating layer 125 having a relatively greater thickness may be disposed between the first channel structure CH1 and the second channel structure CH2. However, the thicknesses and the shapes of the interlayer insulating layers 120 and the upper interlayer insulating layer 125 may be varied in the example embodiments.

The second gate dielectric layer 145B may horizontally extend along upper and lower surfaces of the gate electrodes 130, and may cover side surfaces of the gate electrodes 130 facing the channel structure CH and side surfaces of ends of the gate electrodes 130.

As illustrated in FIG. 3A, the second gate dielectric layer 145B may extend along the second pad portion 130P2, but may not extend to the first pad portion 130P1, in the pad regions 130P. The second gate dielectric layer 145B may be removed from at least a portion of a lower surface and an upper surface of the first pad portion 130P1 and may expose the gate electrodes 130. Side surfaces of the gate electrodes 130 below the pad regions 130P may be in direct contact with the contact insulating layer 160 without the second gate dielectric layer 145B interposed therebetween.

The contact plugs 170 may be connected to the pad regions 130P of the uppermost gate electrodes 130 in the second region R2. The contact plugs 170 may penetrate at least a portion of the cell region insulating layer 190 and may be connected to each of the pad regions 130P of the gate electrodes 130 exposed upwardly. The contact plugs 170 may penetrate the gate electrodes 130 below the pad regions 130P, may penetrate the horizontal insulating layer 110, the second horizontal conductive layer 104, and the second substrate 101, and may be connected to the circuit interconnection lines 280 in the peripheral circuit region PERI. The contact plugs 170 may be spaced apart from the gate electrodes 130 disposed below the pad regions 130P by the contact insulating layers 160. The contact plugs 170 may be spaced apart from the horizontal insulating layer 110, the second horizontal conductive layer 104, and the second substrate 101 by the contact insulating layers 160 and the substrate insulating layer 121.

The contact plugs 170 may include lower and upper contact plugs disposed on a level corresponding to a level of the first and second channel structures CH1 and CH2, and a bent portion may be formed according to a difference in width between the lower and upper contact plugs. The contact plugs 170 may have a cylindrical shape having a width decreasing toward the second substrate 101 due to an aspect ratio. The width of the contact plug 170 may be discontinuously changed in the upper and lower portions with respect to the first pad portion 130P1.

As illustrated in FIG. 3A, the contact plug 170 may be bent along an upper surface and an external side surface of the first pad portion 130P1 from which the second gate dielectric layer 145B is removed, and may have a reduced diameter in a region surrounded by the first pad portion 130P1. The contact plug 170 may have a shape in which a diameter may increase again below the first pad portion 130P1 and a width may decrease toward the second substrate 101. In the example embodiment, the contact plug 170 may have a first width W1 or a first diameter on the pad region 130P and a second width W2 smaller than the first width W1 below the pad region 130P, which may be obtained by a relative degree of etching the cell region insulating layer 190 and the interlayer insulating layers 120 when the semiconductor device 100 is manufactured. The contact plug 170 may have a third width W3 or a third diameter smaller than the first width W1 and the second width W2 on a level corresponding to a level of the pad region 130P.

The contact plugs 170 may include a barrier layer 172 on sidewalls and bottom surfaces of the contact holes in which the contact plugs 170 are disposed, and a contact conductive layer 174 filling the contact holes on the barrier layer 172. The barrier layer 172 may include, for example, at least one of titanium (Ti), titanium nitride (TiN), tantalum (Ta), and tantalum nitride (TaN). The contact conductive layer 174 may include, for example, at least one of tungsten (W), copper (Cu), aluminum (Al), and an alloy thereof. The contact plugs 170 may have an air gap SE region therein. However, the presence and the size of the air gap SE region may be varied depending on a diameter, an aspect ratio, and a material of the contact plugs 170.

The contact plugs 170 may be disposed to penetrate the gate electrodes 130, such that the contact plugs 170 may be self-aligned in the pad regions 130P. Also, the contact plugs 170 may be in contact with upper surfaces and side surfaces of the first pad portions 130P1, which are protruding regions, such that a contact area with the connected gate electrodes 130 may be secured.

The substrate contacts 175 may be disposed to be connected to the second substrate 101 on an external side of the gate electrodes 130. Lower ends of the substrate contacts 175 may be disposed in the second substrate 101.

The through vias 180 may be disposed in the third region R3, may penetrate the memory cell region CELL, and may extend to the peripheral circuit region PERI. The through vias 180 may be disposed to connect the upper interconnections 185 of the memory cell region CELL to the circuit interconnection lines 280 of the peripheral circuit region PERI. The through vias 180 may be disposed to penetrate the stack structure of the sacrificial insulating layers 118 and the interlayer insulating layers 120 in a region in which the sacrificial insulating layers 118 remain without being replaced with the gate electrodes 130.

As illustrated in FIG. 4, side surfaces of the sacrificial insulating layers 118 may protrude further than side surfaces of the interlayer insulating layers 120 toward the through via 180 around the through via 180. Accordingly, an external side surface of the through via 180 may have protrusions corresponding to the interlayer insulating layers 120. However, in example embodiments, the presence and the degree of protruding of the protrusions of the through via 180 may be varied depending on the degree of protruding of the side surfaces of the sacrificial insulating layers 118 and the thickness of the via insulating layer 168.

Similarly to the contact plugs 170, the substrate contacts 175 and the through vias 180 may have bent portions disposed on a level corresponding to a level of a boundary between the first and second channel structures CH1 and CH2.

The substrate contacts 175 and the through vias 180 may be formed in the same process as a process of forming the contact plugs 170 and may include the same material. For example, the through vias 180 may have a via barrier layer 182 on a sidewalls and bottom surfaces of the via holes in which the through vias 180 are disposed, and a via conductive layer 184 filling the via holes on the via barrier layer 182, similarly to the contact plugs 170. The material of the contact plugs 170 described above may be applied to the materials of the via barrier layer 182 and the via conductive layer 184. Although not illustrated in detail, the substrate contacts 175 may also include a barrier layer and a conductive layer, similarly to the contact plugs 170 and the through vias 180.

The contact insulating layers 160 may be disposed to surround side surfaces of the contact plugs 170. The contact insulating layers 160 surrounding each of the contact plugs 170 may be vertically spaced apart from each other. Specifically, as illustrated in FIG. 3A, the contact insulating layer 160 may include an upper contact insulating layer 160U extending to an upper surface of the pad region 130P along the contact plug 170, and a lower contact insulating layer 160L extending by being bent from a lower surface of the first pad portion 130P1 below the pad region 130P. The lower contact insulating layer 160L may have a bent portion bent from the lower surface of the first pad portion 130P1, and may extend in the z direction between the gate electrodes 130 and the interlayer insulating layers 120, and the contact plug 170. The gate electrodes 130 below the pad regions 130P may be electrically isolated from the contact plug 170 by the lower contact insulating layer 160L.

The substrate contact insulating layer 165 may be disposed to surround the substrate contacts 175.

The via insulating layers 168 may be disposed to surround side surfaces of the through vias 180. The via insulating layers 168 surrounding each of the through vias 180 may be vertically spaced apart from each other. As illustrated in FIG. 4, the via insulating layers 168 may include an upper via insulating layer extending to an upper surface of an uppermost sacrificial insulating layer 118, and a lower via insulating layer extending downwardly from a side surface of the uppermost sacrificial insulating layer 118.

The contact insulating layers 160, the substrate contact insulating layer 165, and the via insulating layers 168 may be formed in the same process and may include the same material. The contact insulating layers 160, the substrate contact insulating layer 165, and the via insulating layers 168 may include an insulating material, and may include at least one of silicon oxide, silicon nitride, and silicon oxynitride, for example.

The upper interconnections 185 may form an upper interconnection structure electrically connected to the memory cells in the memory cell structure CELL. The upper interconnections 185 may be connected to the contact plugs 170, the substrate contacts 175, and the through vias 180, and may be electrically connected to the gate electrodes 130. The upper interconnections 185 may also be connected to the channel structures CH in a region not illustrated. In example embodiments, the number of the contact plugs and the number of the interconnection lines included in the upper interconnection structure may be varied. For example, contact plugs may be further disposed between the upper interconnections 185 and the contact plugs 170. The upper interconnections 185 may include a metal, and may include, for example, tungsten (W), copper (Cu), aluminum (Al), or the like.

The cell region insulating layer 190 may be disposed to cover the second substrate 101, the gate electrodes 130 on the second substrate 101, and the peripheral region insulating layer 290. The cell region insulating layer 190 may be formed of an insulating material, or may include a plurality of insulating layers.

Figure 5A:
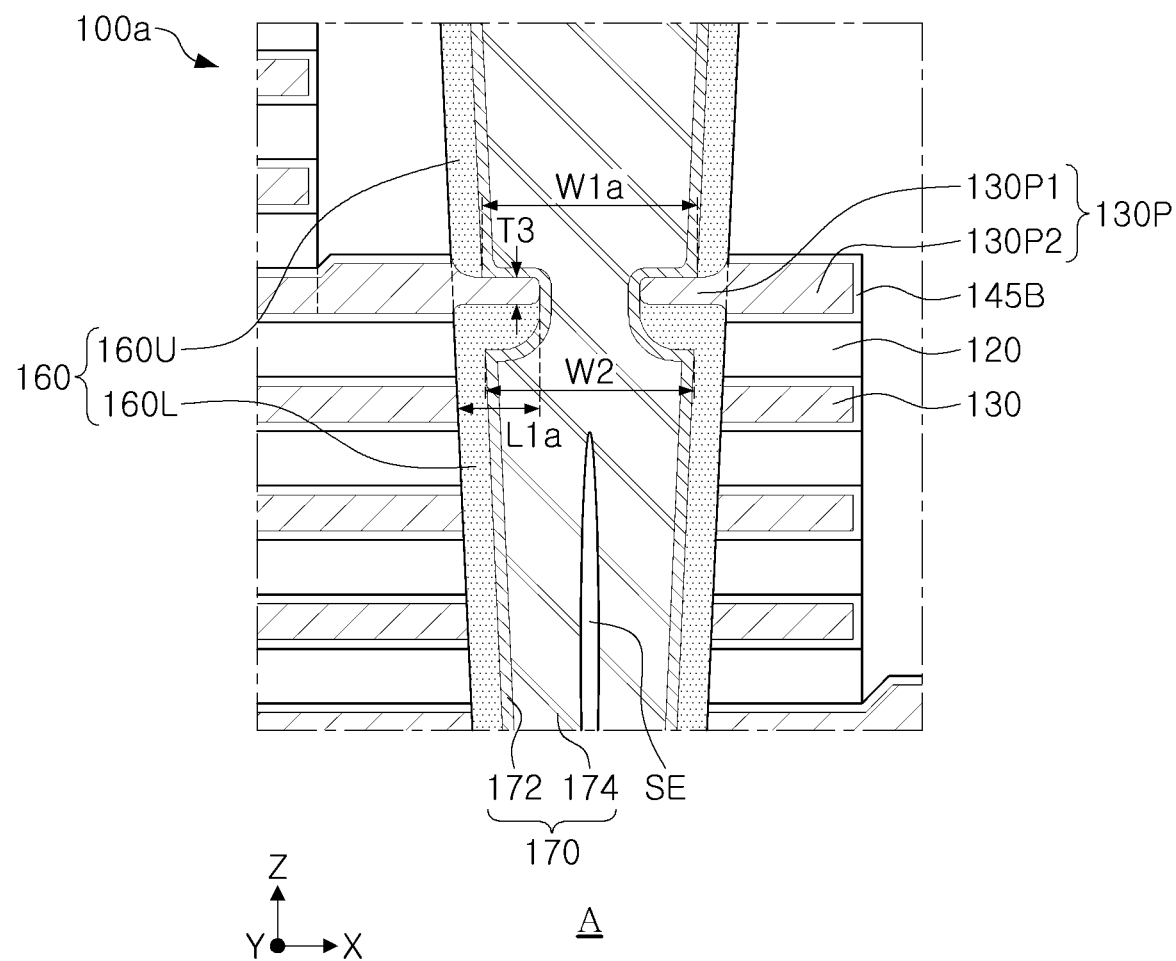
FIGS. 5A and 5B are enlarged views illustrating a partial region of a semiconductor device according to an example embodiment of the present disclosure.
Figure 5B:
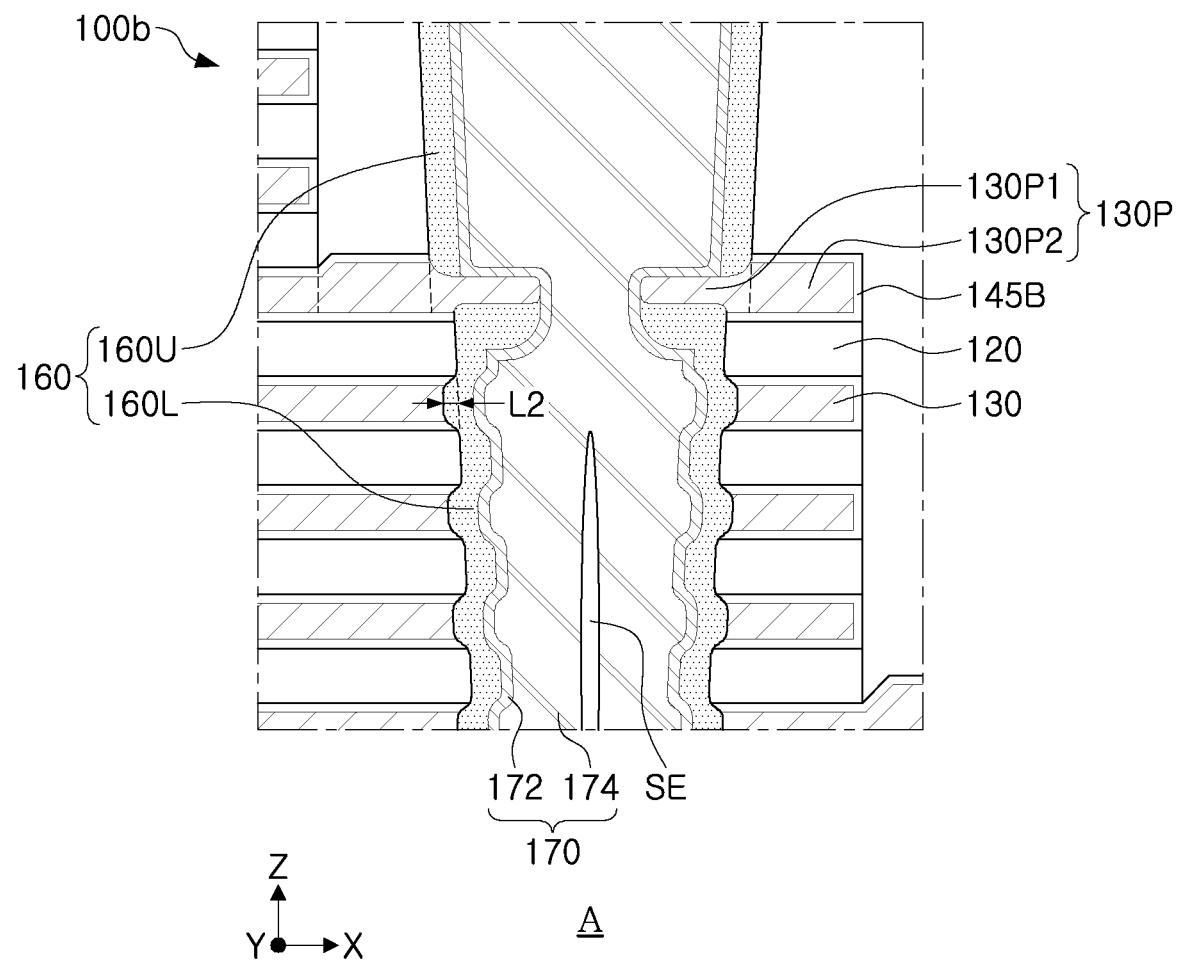

FIGS. 5A and 5B are enlarged views illustrating a partial region of a semiconductor device according to an example embodiment, illustrating a region corresponding to FIG. 3A.

Referring to FIG. 5A, in a semiconductor device 100*a*, the shapes of the first pad portion 130P1 of the pad region 130P, the contact plug 170, and the contact insulating layer 160 may be different from the example illustrated in FIG. 3A.

In the first pad portion 130P1, a point in which the level of the upper surface is lowered and a point in which the level of the lower surface is increased may be disposed linearly in the z direction. For example, the two points may be disposed linearly along an inclination of the side surface of the contact plug 170. Also, a length L1*a* in which an external side surface of the first pad portion 130P1 protrudes from the side surfaces of the lower gate electrodes 130 may also be relatively reduced.

The contact plug 170 may have a shape in which a difference between a first width W1a on the pad region 130P and a second width W2 below the pad region 130P is reduced. For example, the first width W1a and the second width W2 may have only a difference in width due to the inclination or tapering of the contact plug 170. In the contact insulating layers 160, the lower contact insulating layer 160L and the upper contact insulating layer 160U may be disposed linearly along the inclination of the side surface of the contact plug 170 in the z direction.

The shape of the first pad portion 130P1, the contact plug 170, and the contact insulating layer 160 may be formed when the degree of removing the cell region insulating layer 190 in the x direction is similar to the degree of removing the interlayer insulating layers 120 in the manufacturing process described with reference to FIG. 11H. As such, in example embodiments, the shape of the first pad portion 130P1 and the width of the contact plug 170 around the first pad portion 130P1 may be varied.

Referring to FIG. 5B, in a semiconductor device 100b, the gate electrodes 130 may be relatively recessed further than the interlayer insulating layers 120 below the first pad portion 130P1 of the pad region 130. Accordingly, side surfaces of the interlayer insulating layers 120 may protrude further than the side surfaces of the gate electrodes 130 by a predetermined length L2. The contact insulating layer 160 may have a curved shape along the recessed shape, and the contact plug 170 may also have a curved shape according to the curved shape of the contact insulating layer 160, but an example embodiment thereof is not limited thereto.

The shape of the gate electrodes 130 may be formed according to the etching degree of the gate electrodes 130 during the manufacturing process described with reference to FIG. 11I. As such, in example embodiments, the relative positions of the side surfaces of the gate electrodes 130 and the side surfaces of the interlayer insulating layers 120, and the shape of the contact insulating layer 160 according to the relative positions may be varied.

Figure 6:
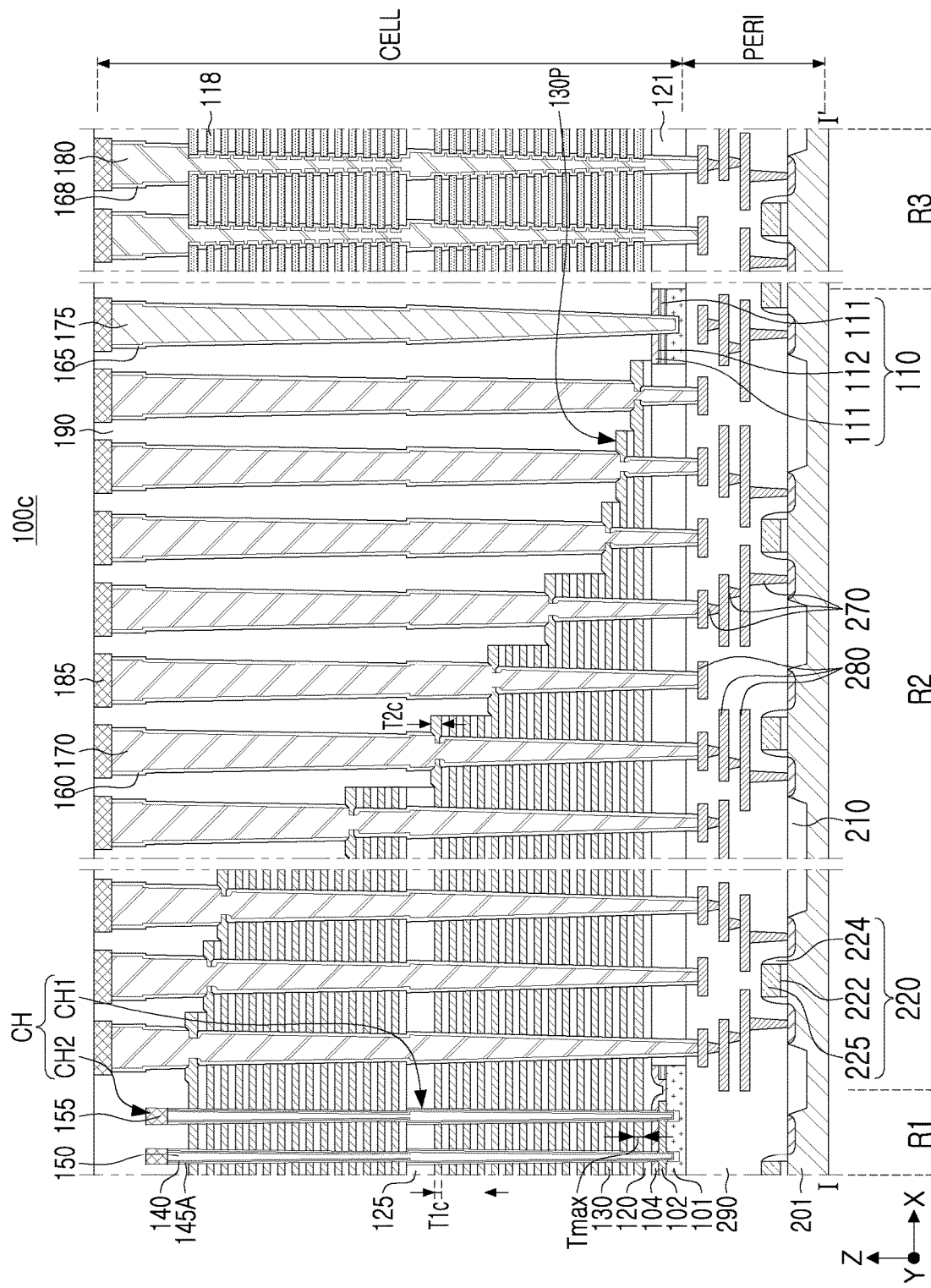
FIG. 6 is a cross-sectional view illustrating a semiconductor device according to an example embodiment of the present disclosure.

FIG. 6 is a cross-sectional view illustrating a semiconductor device according to an example embodiment, illustrating a cross-sectional view corresponding to FIG. 2A.

Referring to FIG. 6, in a semiconductor device 100c, at least a portion of the gate electrodes 130 may have different thicknesses in a region other than the pad regions 130P. For example, the lowermost gate electrode 130 and the uppermost gate electrode 130 may have a thickness relatively greater than those of other gate electrodes 130. For example, the lowermost gate electrode 130 may have a maximum thickness $T_{max}$, the greatest thickness among the thicknesses of the gate electrodes 130. In this case, the second thickness T2c in the pad regions 130P of the gate electrodes 130 may be greater than the maximum thickness $T_{max}$. In other words, the second thickness T2c may be greater than the first thickness T1c in the first region R1 within the same gate electrode 130, and may also be greater than the maximum thickness $T_{max}$ in the first region R1 of the entire stack of gate electrodes 130.

The above configuration may be a condition for reducing or preventing the lower gate electrodes 130 from protruding as the first pad portion 131P remains and the gate electrodes 130 are trimmed in the manufacturing process described with reference to FIG. 11I. Accordingly, the example embodiment may be applied to all example embodiments in which the thicknesses of the gate electrodes 130 are not constant.

Figure 7:
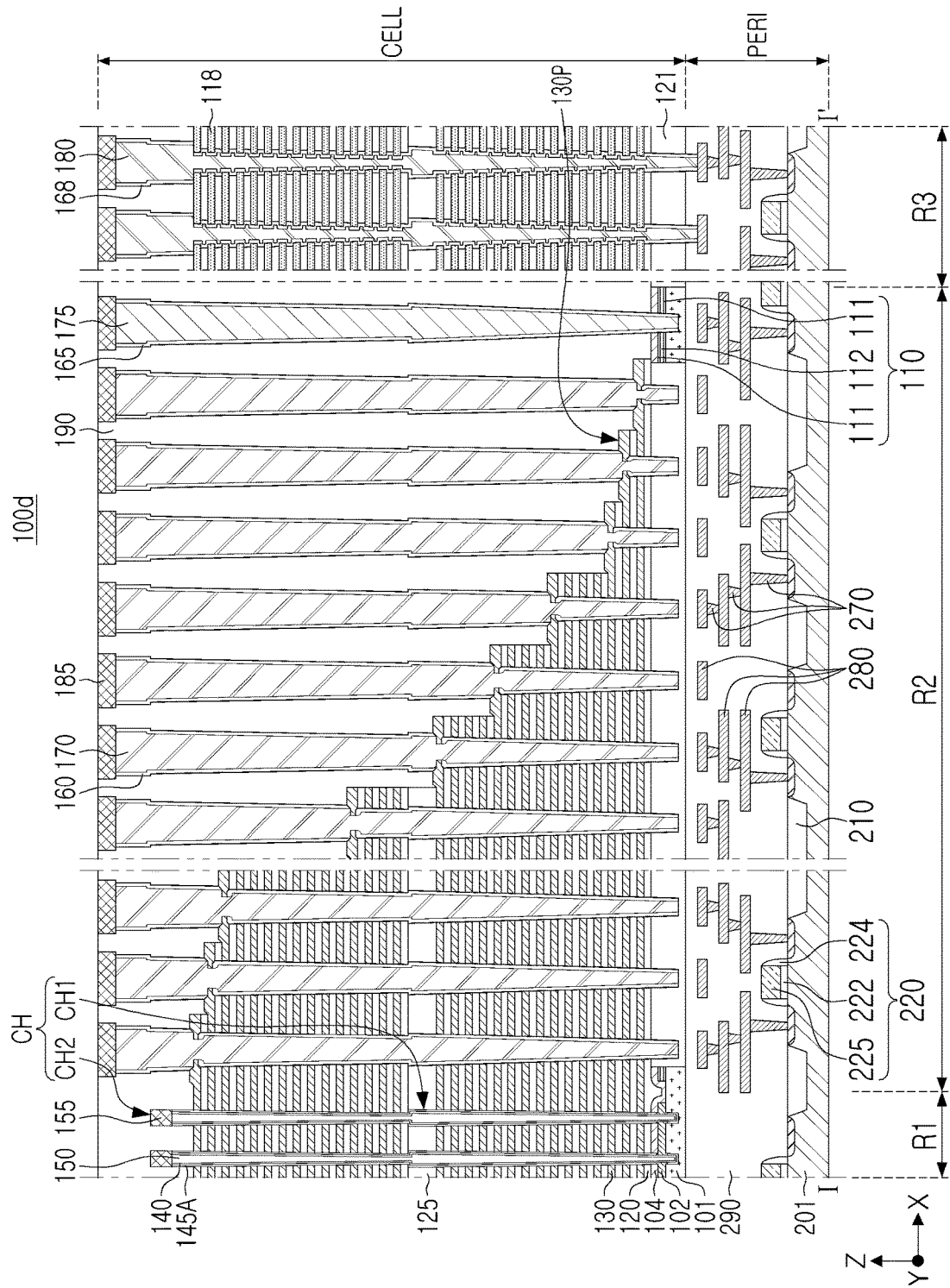
FIG. 7 is a cross-sectional view illustrating a semiconductor device according to an example embodiment of the present disclosure.

FIG. 7 is a cross-sectional view illustrating a semiconductor device according to an example embodiment, illustrating a cross-sectional view corresponding to FIG. 2A.

Referring to FIG. 7, in a semiconductor device 100d, the contact plugs 170 may not extend into the peripheral circuit region PERI, and lower ends of the contact plugs 170 may be disposed in the substrate insulating layer 121. In some example embodiments, lower ends of the contact plugs 170 may be disposed on the upper surface of the substrate insulating layer 121.

In example embodiments, the lower ends of the contact plugs 170 may be disposed in the second substrate 101 on which the substrate insulating layer 121 is not formed, rather than being disposed in the substrate insulating layer 121. In this case, the second substrate 101 may be divided into a plurality of portions such that the contact plugs 170 are not electrically connected to each other in the second region R2. Alternatively, the lower ends of the contact plugs 170 may be disposed in an insulating region in the second substrate 101 extending from the upper surface of the second substrate 101.

In the example embodiment, the contact plugs 170 may be electrically connected to the circuit devices 220 of the peripheral circuit region PERI through the upper interconnections 185 and the through vias 180 disposed thereon.

Figure 8:
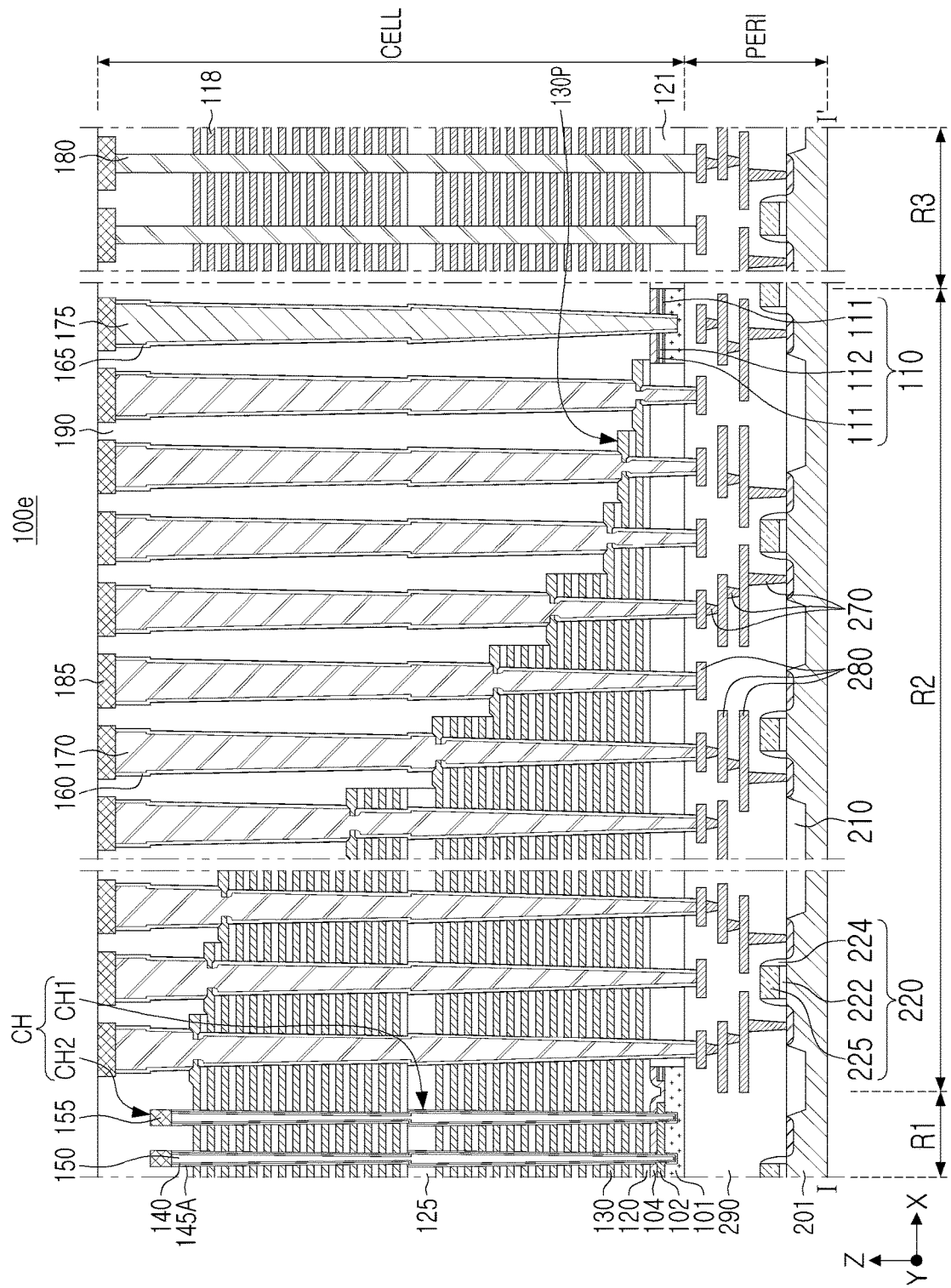
FIG. 8 is a cross-sectional view illustrating a semiconductor device according to an example embodiment of the present disclosure.

FIG. 8 is a cross-sectional view illustrating a semiconductor device according to an example embodiment, illustrating a cross-sectional view corresponding to FIG. 2A.

Referring to FIG. 8, in a semiconductor device 100e, the through vias 180 may have a shape and/or a structure different from those of the example embodiments in FIGS. 2A and 4. The through vias 180 may be disposed to penetrate the sacrificial insulating layers 118 and the interlayer insulating layers 120 without a protrusion of the side surface thereof. Also, the via insulating layers 168 (see FIG. 2A) surrounding the through vias 180 may also not be provided. Also, the bent portion on a level corresponding to a boundary between the through vias 180 and the first and second channel structures CH1 and CH2 may not be provided. The internal structures and the material of the through vias 180 may be the same as or different from those of the contact plugs 170.

The structure of the through vias 180 may be obtained as the through vias 180 are formed separately from the contact plugs 170 in a different process. In example embodiments, the substrate contacts 175 may also have a shape different from that of the contact plugs 170, and accordingly, the substrate contact insulating layers 165 may not be provided.

Figure 9:
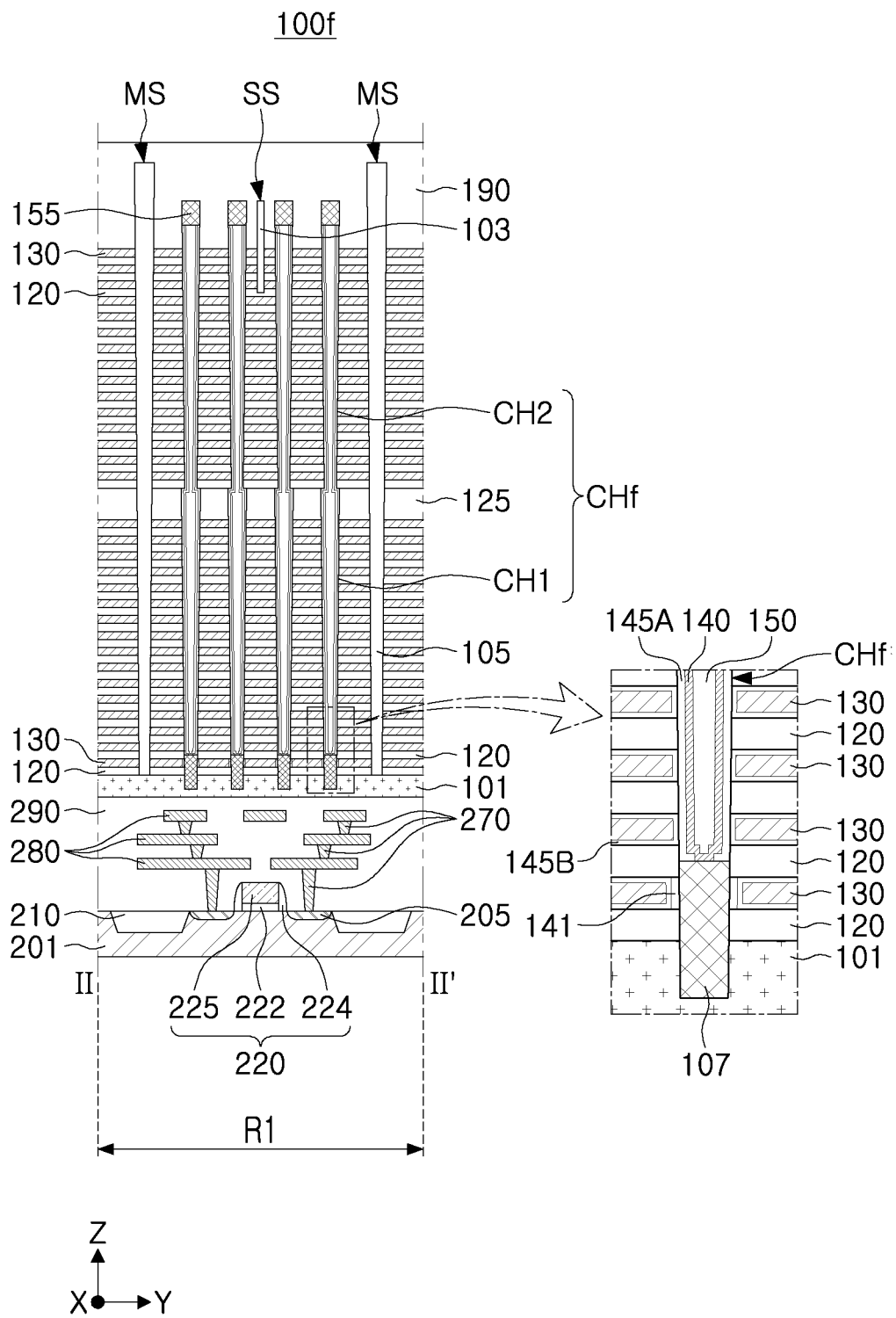
FIG. 9 is a cross-sectional view illustrating a semiconductor device according to an example embodiment of the present disclosure.

FIG. 9 is a cross-sectional view illustrating a semiconductor device according to an example embodiment, illustrating a cross-sectional view corresponding to FIG. 2B.

Referring to FIG. 9, in a semiconductor device 100f, the memory cell structure CELL may not include the first and second horizontal conductive layers 102 and 104 on the second substrate 101, in contrast with the example embodiment in FIG. 2A. Also, the channel structure CHf may further include an epitaxial layer 107. The substrate insulating layer 121 may be disposed to penetrate the second substrate 101.

The epitaxial layer 107 may be disposed on the second substrate 101 on a lower end of the channel structure CHf, and may be disposed on a side surface of the at least one gate electrode 130. The epitaxial layer 107 may be disposed in the recessed region of the second substrate 101. A level of an upper surface of the epitaxial layer 107 may be higher than a level of an upper surface of the lowermost gate electrode 130 and may be lower than a level of a lower surface of the upper gate electrode 130, but an example embodiment thereof is not limited thereto. The epitaxial layer 107 may be connected to the channel layer 140 through the upper surface. A gate insulating layer 141 may be further disposed between the epitaxial layer 107 and the adjacent gate electrode 130.

Figure 10:
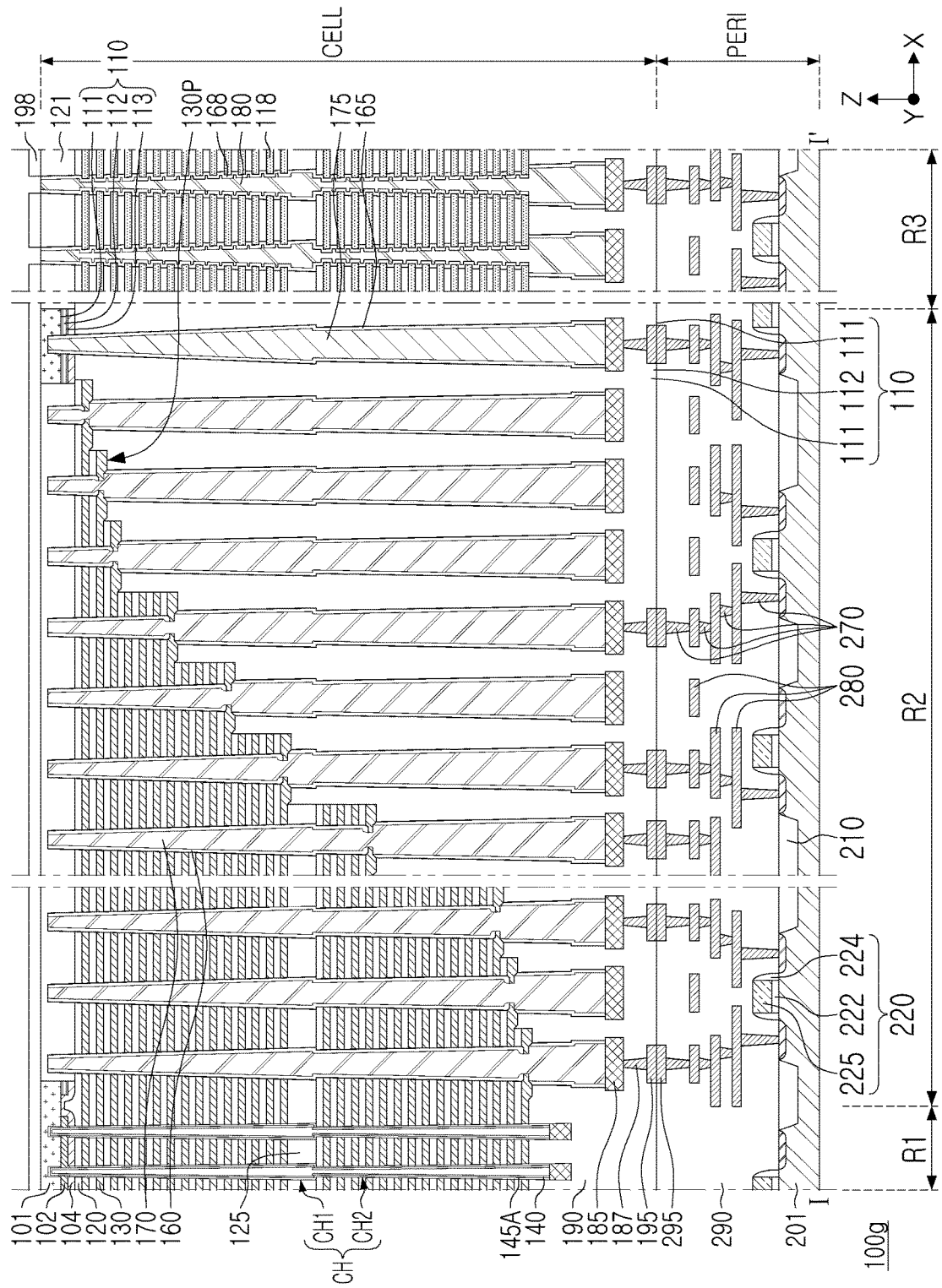
FIG. 10 is a cross-sectional view illustrating a semiconductor device according to an example embodiment of the present disclosure.

FIG. 10 is a cross-sectional view illustrating a semiconductor device according to an example embodiment, illustrating a cross-sectional view corresponding to FIG. 2A.

Referring to FIG. 10, a semiconductor device 100g may have a structure in which the peripheral circuit region PERI and the memory cell region CELL are vertically bonded to each other. To this end, the peripheral circuit region PERI may further include first bonding metal layers 295, and the memory cell region CELL may further include bonding vias 187, second bonding metal layers 195, and a passivation layer 198 on the second substrate 101.

The first bonding metal layers 295 may be disposed on the circuit contact plugs 270 and the circuit interconnection lines 280 such that an upper surface of the first bonding metal layer 295 may be exposed to an upper surface of the peripheral circuit region PERI through the peripheral region insulating layer 290. The second bonding metal layers 195 may be disposed below the bonding vias 187, such that a lower surface of the second bonding metal layer 195 may be exposed to a lower surface of the memory cell region CELL through the cell region insulating layer 190. The first bonding metal layers 295 and the second bonding metal layers 195 may include a conductive material, such as, for example, copper (Cu). In example embodiments, each of the peripheral region insulating layer 290 and the cell region insulating layer 190 may further include a bonding dielectric layer surrounding the first bonding metal layers 295 and the second bonding metal layers 195, and being disposed from one surface by a predetermined depth. The bonding dielectric layer may include, for example, at least one of SiO, SiN, SiCN, SiOC, SiON, and SiOCN. The passivation layer 198 may be disposed on the second substrate 101 to protect the second substrate 101, and may include an insulating material.

The peripheral circuit region PERI and the memory cell region CELL may be bonded to each other by bonding the first bonding metal layers 295 to the second bonding metal layers 195 and bonding the bonding dielectric layers to each other. The bonding of the first bonding metal layers 295 to the second bonding metal layers 195 may be, for example, copper (Cu)-to-copper (Cu) bonding, and the bonding of the bonding dielectric layers may be, for example, a dielectric-to-dielectric bonding such as a SiCN—SiCN bonding. The peripheral circuit structure PERI and the memory cell structure CELL may be bonded by hybrid bonding including copper (Cu)-to-copper (Cu) bonding and dielectric-to-dielectric bonding.

In the third region R3, upper surfaces of the through vias 180 may be exposed through the passivation layer 198 and may be used as input/output pads. However, the structure of the upper ends of the through vias 180 is not necessarily exposed, and may be varied in example embodiments.

FIGS. 11A to 11L are cross-sectional views illustrating a method of manufacturing a semiconductor device according to an example embodiment, illustrating a cross-sectional view corresponding to FIG. 2A.

Figure 11A:
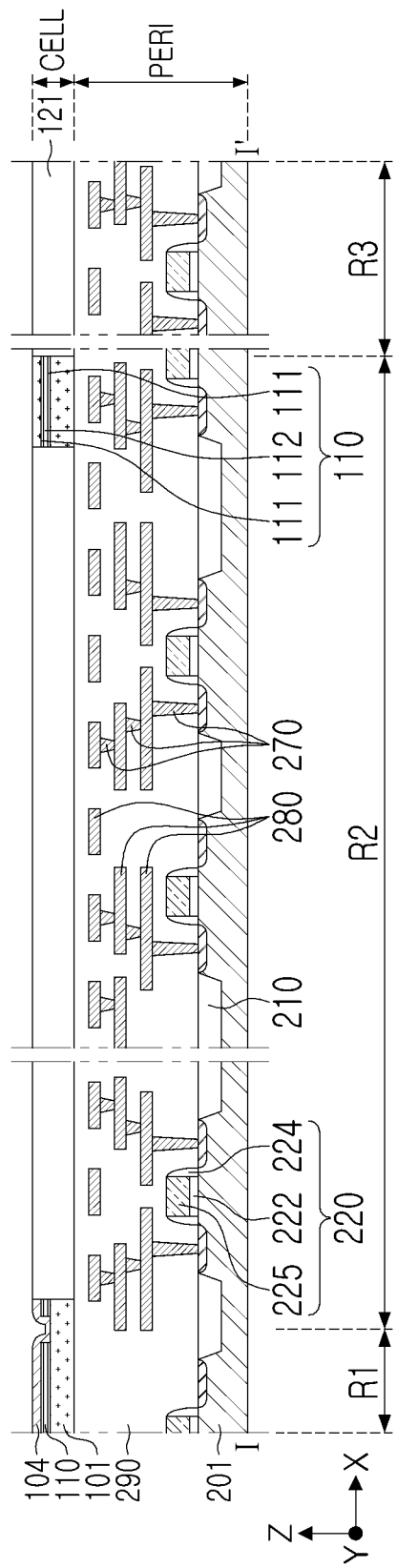
FIGS. 11A, 11B, 11C, 11D, 11E, 11F, 11G, 11H, 11I, 11J, 11K, and 11L are cross-sectional views illustrating a method of manufacturing a semiconductor device according to an example embodiment of the present disclosure.

Referring to FIG. 11A, a peripheral circuit region PERI including circuit devices 220 and lower interconnection structures may be formed on the first substrate 201, and a second substrate 101 on which the memory cell region CELL is provided, a horizontal insulating layer 110, a second horizontal conductive layer 104, and a substrate insulating layer 121 may be formed on the peripheral circuit region PERI.

First, the device isolation layers 210 may be formed in the first substrate 201, and the circuit gate dielectric layer 222 and the circuit gate electrode 225 may be formed in order on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but an example embodiment thereof is not limited thereto. Thereafter, a spacer layer 224 and source/drain regions 205 may be formed on opposing sides of the circuit gate dielectric layer 222 and the circuit gate electrode 225. In example embodiments, the spacer layer 224 may include a plurality of layers. Thereafter, the source/drain regions 205 may be formed by performing an ion implantation process.

The circuit contact plugs 270 of the lower interconnection structures may be formed by partially forming the peripheral region insulating layer 290, removing a portion thereof by etching, and filling conductive material therein. The circuit interconnection lines 280 may be formed by depositing a conductive material and patterning the material, for example.

The peripheral region insulating layer 290 may include a plurality of insulating layers. A portion of the peripheral region insulating layer 290 may be formed in each process of forming the lower interconnection structures, and another portion thereof may be formed on the uppermost circuit interconnection line 280, such that the peripheral region insulating layer 290 may cover the circuit devices 220 and the lower interconnection structures.

Thereafter, the second substrate 101 may be formed on the peripheral region insulating layer 290. The second substrate 101 may be formed of polycrystalline silicon, for example, and may be formed by a CVD process. Polysilicon forming the second substrate 101 may include impurities.

The first and second horizontal insulating layers 111 and 112 included in the horizontal insulating layer 110 may be alternately stacked on the second substrate 101. The horizontal insulating layer 110 may be partially replaced with the first horizontal conductive layer 102 in FIG. 2A through a subsequent process. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the sacrificial insulating layers 118 subsequently formed. The horizontal insulating layer 110 may be partially removed by a patterning process in partial regions, in the second region R2 of the second substrate 101, for example.

The second horizontal conductive layer 104 may be formed on the horizontal insulating layer 110, and may be in contact with the second substrate 101 in a region from which the horizontal insulating layer 110 is removed. Accordingly, the second horizontal conductive layer 104 may be bent along ends of the horizontal insulating layer 110, may cover the ends, and may extend to the second substrate 101.

The substrate insulating layer 121 may be formed to penetrate the second substrate 101 in the third region R3 and in regions of the second region R2 in which the contact plugs 170 (see FIG. 2A) are disposed. The substrate insulating layer 121 may be formed by removing a portion of the second substrate 101, the horizontal insulating layer 110, and the second horizontal conductive layer 104, and filling the insulating material therein. After filling the insulating material, a planarization process may be further performed using a chemical mechanical polishing (CMP) process. Accordingly, an upper surface of the substrate insulating layer 121 may be substantially coplanar with an upper surface of the second horizontal conductive layer 104.

Figure 11B:
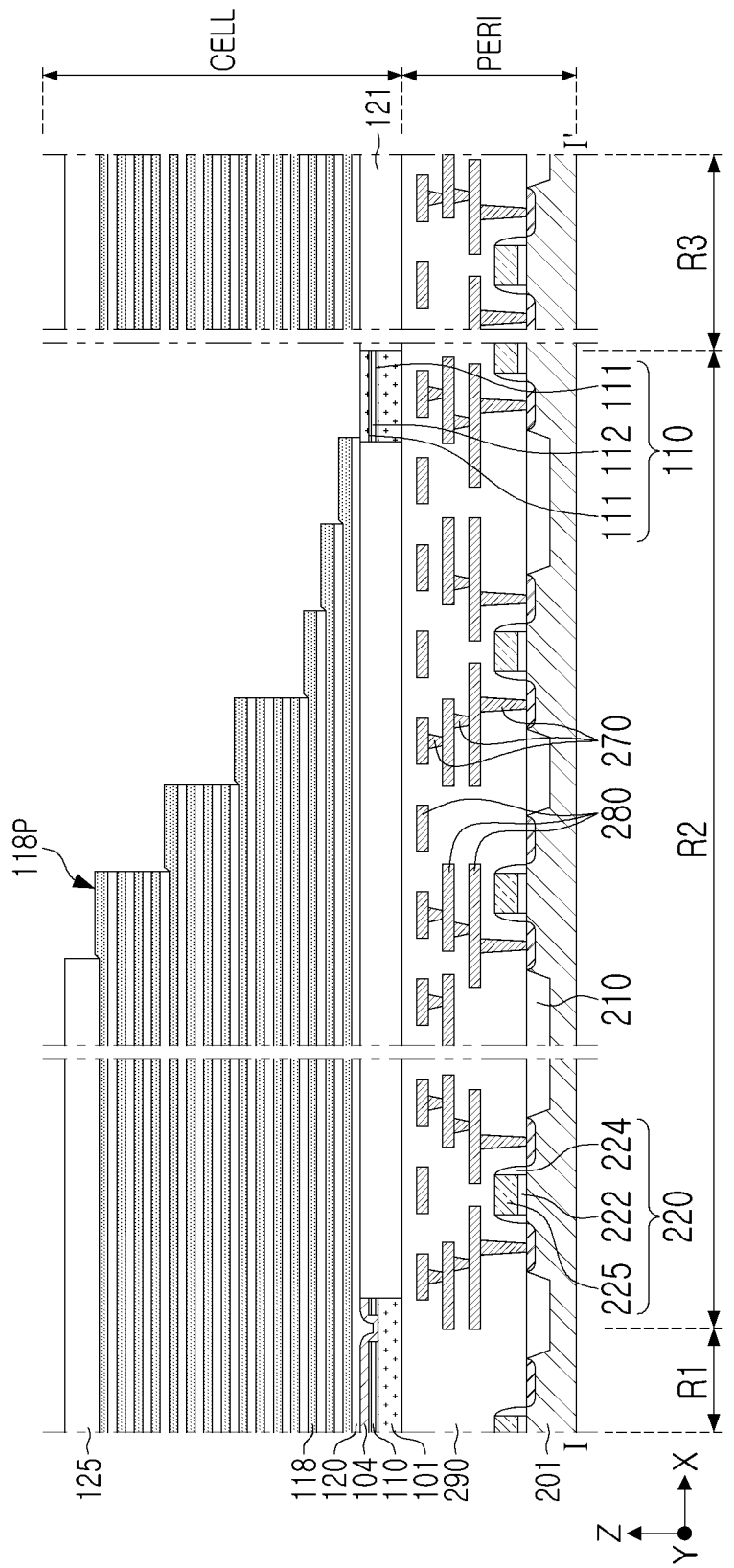

Referring to FIG. 11B, the sacrificial insulating layers 118 and the interlayer insulating layers 120 included in the lower stack structure may be alternately stacked on the second horizontal conductive layer 104, a stepped structure may be formed, and sacrificial pad regions 118P may be formed.

In this process, the sacrificial insulating layers 118 and the interlayer insulating layers 120 may be formed in the region in which the first channel structures CH1 (see FIG. 2B) are disposed. An upper interlayer insulating layer 125 having a relatively greater thickness may be formed on an uppermost portion. The sacrificial insulating layers 118 may be replaced by the gate electrodes 130 (see FIG. 2A) through a subsequent process.

The sacrificial insulating layers 118 may be formed of a material different from that of the interlayer insulating layers 120. For example, the interlayer insulating layer 120 and the upper interlayer insulating layer 125 may be formed of at least one of silicon oxide and silicon nitride, and the sacrificial insulating layers 118 may be formed of a material different from that of the interlayer insulating layer 120, selected from among silicon, silicon oxide, silicon carbide, and silicon nitride. In example embodiments, the thicknesses of the interlayer insulating layers 120 may not be the same. Also, the thicknesses of the interlayer insulating layers 120 and the sacrificial insulating layers 118 and the number of films included in the interlayer insulating layers 120 and the sacrificial insulating layers 118 may be varied from the illustrated examples.

Thereafter, in the second region R2, a photolithography process and an etching process may be repeatedly performed on the sacrificial insulating layers 118 using a mask layer such that the upper sacrificial insulating layers 118 may extend less than the lower sacrificial insulating layers 118. Accordingly, the sacrificial insulating layers 118 may form a stepped structure in a staircase shape by a predetermined unit.

Thereafter, sacrificial insulating layers 118 may be further formed on the stepped structure such that sacrificial pad regions 118P disposed in an uppermost portion in each region may be formed. The sacrificial pad regions 118P may be formed by, for example, a process of forming a nitride layer covering exposed upper and side surfaces of the sacrificial insulating layers 118 along the staircase shape of the lower stack structure, and a process of partially removing the nitride layer and remaining the nitride layer only on the upper surfaces of the sacrificial insulating layers 118. The thickness of the nitride layer may be in the range of about 20% to about 110% of the thickness of the sacrificial insulating layers 118, but an example embodiment thereof is not limited thereto. The process of partially removing the nitride layer may be performed after changing properties of horizontally deposited regions of the nitride layer using plasma, for example. Accordingly, the sacrificial insulating layers 118 may have a relatively large thickness in the sacrificial pad regions 118P.

Figure 11C:
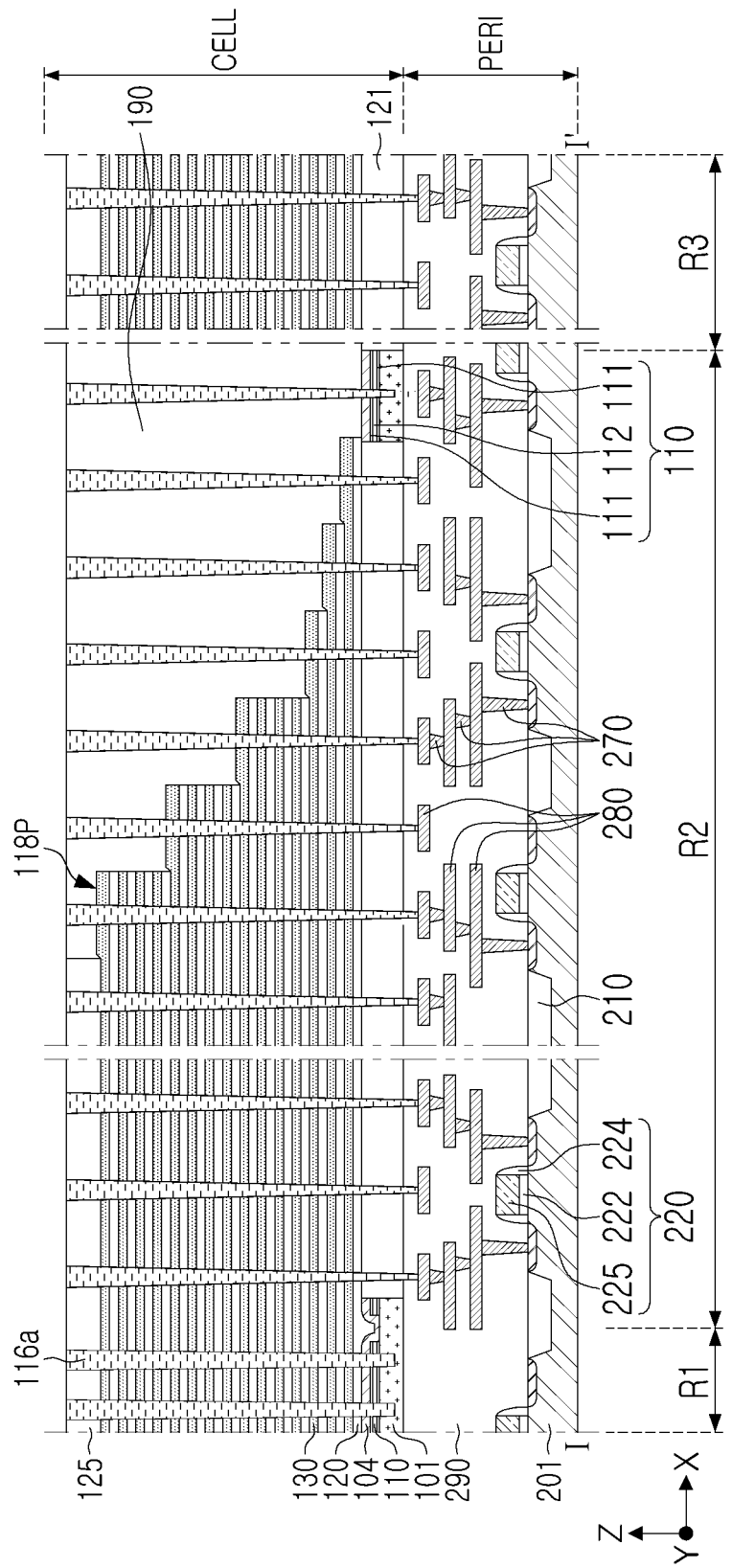

Referring to FIG. 11C, first vertical sacrificial layers 116a penetrating the lower stack structure may be formed.

First, a portion of the cell region insulating layer 190 covering the lower stack structure of the sacrificial insulating layers 118 and the interlayer insulating layers 120 may be formed.

Thereafter, the first vertical sacrificial layers 116a may be formed in a region of the first region R1 corresponding to the first channel structures CH1 in FIG. 2A, and may be formed in a region of the second region R2 in which the contact plugs 170, the substrate contact 175, and the through vias 180 are disposed. The first vertical sacrificial layers 116a may be formed to have different sizes depending on the regions in which the first vertical sacrificial layers 116a are formed.

The first vertical sacrificial layers 116a may be formed by forming lower holes to penetrate the lower stack structure, and depositing a material forming the first vertical sacrificial layers 116a in the lower holes. The first vertical sacrificial layers 116a may include, for example, polycrystalline silicon.

Figure 11D:
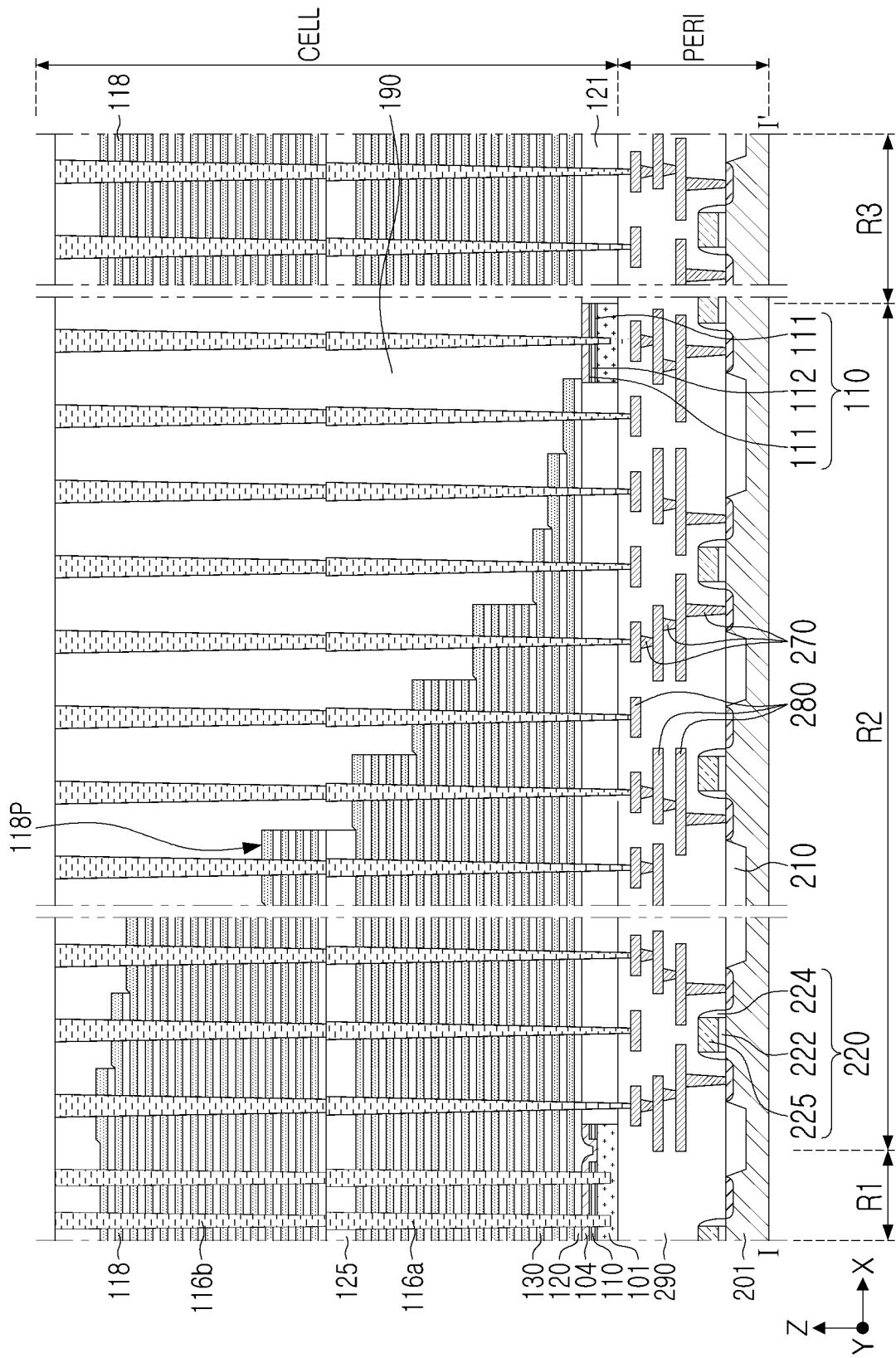

Referring to FIG. 11D, an upper stack structure may be formed, and second vertical sacrificial layers 116b penetrating the upper stack structure may be formed.

The sacrificial insulating layers 118 and the interlayer insulating layers 120 included in the upper stack structure may be alternately stacked on the lower stack structure, a stepped structure may be formed, and sacrificial pad regions 118P may be formed. In this process, in the upper region in which the second channel structures CH2 (see FIG. 2A) are disposed, the same process for forming the lower stack structure described above with reference to FIG. 11B may be performed.

Thereafter, a portion of the cell region insulating layer 190 covering the upper stack structure of the sacrificial insulating layers 118 and the interlayer insulating layers 120 may be further formed, and the second vertical sacrificial layers 116b may be formed.

The second vertical sacrificial layers 116b may be formed by forming upper holes penetrating the upper stack structure to expose upper ends of the first vertical sacrificial layers 116a, and depositing a material forming the second vertical sacrificial layers 116b on the upper holes. The second vertical sacrificial layers 116b may include, for example, polycrystalline silicon.

Figure 11E:
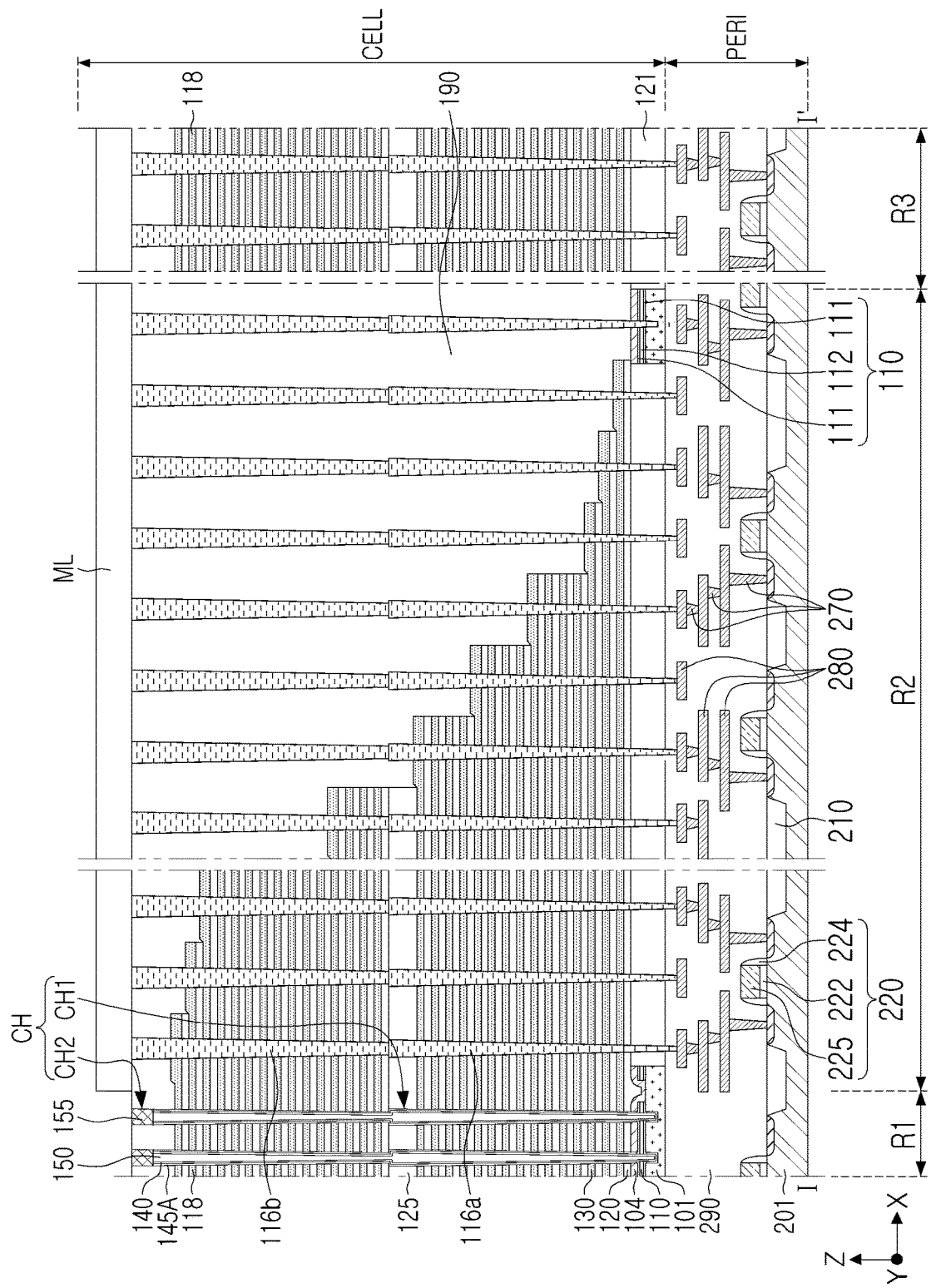

Referring to FIG. 11E, in the first region R1, the first and second vertical sacrificial layers 116a and 116b may be removed and channel structures CH may be formed.

An upper separation region SS (see FIG. 2B) may be formed by removing a portion of the sacrificial insulating layers 118 and the interlayer insulating layers 120. To form the upper separation region SS, a region in which the upper separation region SS is formed may be exposed using a mask layer, a predetermined number of the sacrificial insulating layers 118 and the interlayer insulating layers 118 and interlayer insulating layers may be removed from an uppermost portion, and an insulating material may be deposited, thereby forming an upper separation insulating layer 103 (see FIG. 2B).

Thereafter, a mask layer ML exposing the first region R1 may be formed on the upper stack structure, and channel structures CH may be formed in the first region R1. The channel structures CH may be formed by forming channel holes by removing the first and second vertical sacrificial layers 116a and 116b, and filling the channel holes. Specifically, the first gate dielectric layer 145A, the channel layer 140, the channel filling insulating layer 150, and the channel pads 155 may be formed in order in the channel holes, thereby forming the channel structures CH. The channel layer 140 may be formed on the first gate dielectric layer 145A in the channel structures CH. The channel filling insulating layer 150 may be formed to fill the channel structures CH, and may be an insulating material. However, in example embodiments, the space between the channel layers 140 may be filled with a conductive material, instead of the channel filling insulating layer 150. The channel pads 155 may be formed of a conductive material, such as, for example, polycrystalline silicon.

Figure 11F:
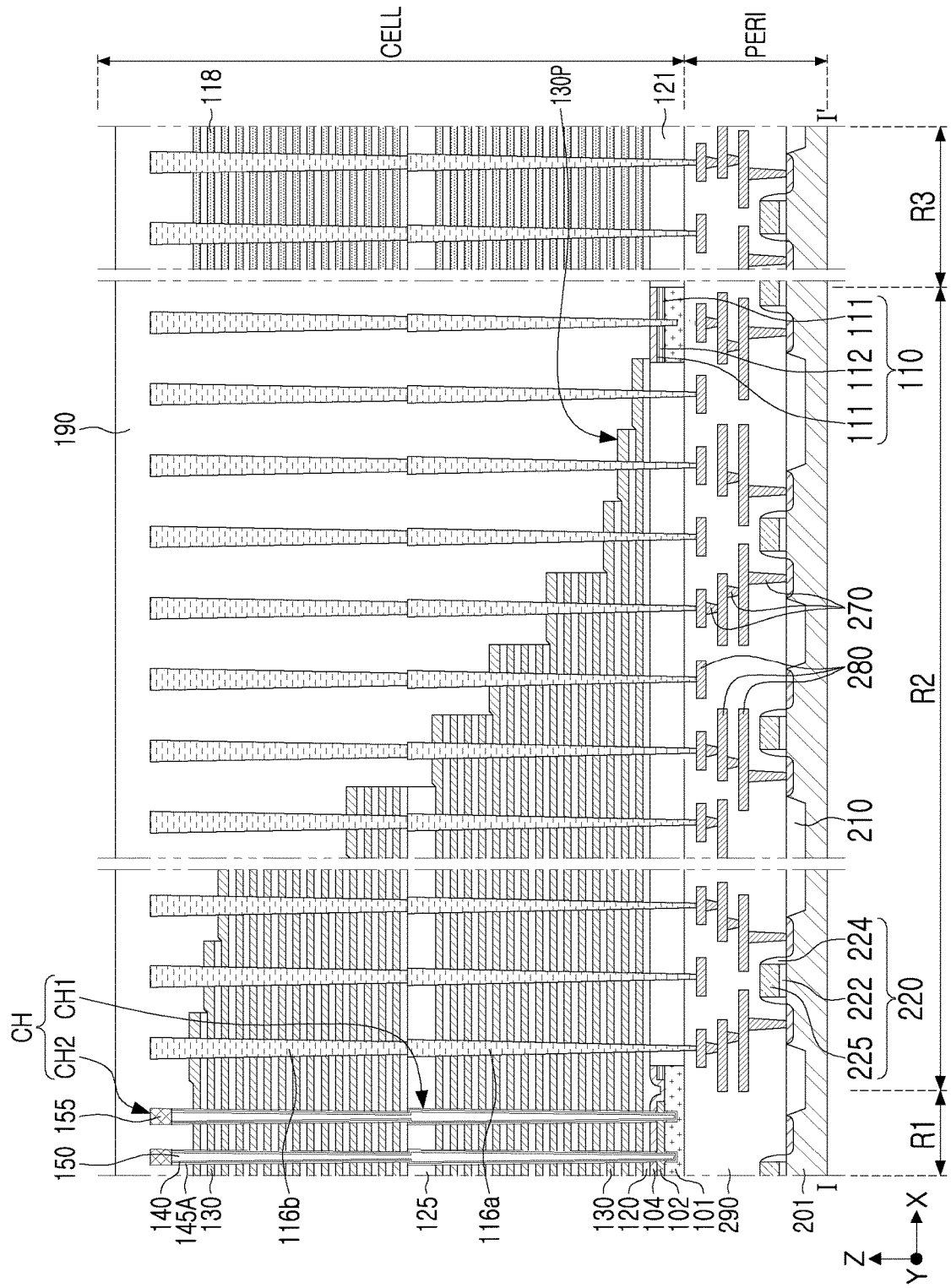

Referring to FIG. 11F, the first horizontal conductive layer 102 may be formed by partially removing the horizontal insulating layer 110, and the gate electrodes 130 may be formed by removing the sacrificial insulating layers 118.

The cell region insulating layer 190 may be further formed, and openings penetrating the sacrificial insulating layers 118 and the interlayer insulating layers 120 and extending to the second substrate 101 may be formed in a position corresponding to the separation regions MS (see FIG. 1).

Thereafter, by performing an etch-back process while forming sacrificial spacer layers in the openings, the second horizontal insulating layer 112 may be exposed in the first region R1. The second horizontal insulating layer 112 may be selectively removed from the exposed region, and the upper and lower first horizontal insulating layers 111 may be removed. The first and second horizontal insulating layers 111 and 112 may be removed by a wet etching process, for example. In the process of removing the first and second horizontal insulating layers 111 and 112, a portion of the first gate dielectric layer 145A exposed in the region from which the second horizontal insulating layer 112 is removed may also be removed. The first horizontal conductive layer 102 may be formed by depositing a conductive material in the region from which the first and second horizontal insulating layers 111 and 112 are removed, and the sacrificial spacer layers may be removed from the openings. Through this process, the first horizontal conductive layer 102 may be formed in the first region R1.

Thereafter, the sacrificial insulating layers 118 including the sacrificial pad regions 118P may be selectively removed with respect to the interlayer insulating layers 120, the second horizontal conductive layer 104, the substrate insulating layer 121 using wet etching, for example.

In the region from which the sacrificial insulating layers 118 are removed, second gate dielectric layers 145B (see FIG. 3A) and gate electrodes 130 may be formed. The second gate dielectric layers 145B may be deposited before the gate electrodes 130 and may cover upper, lower, and side surfaces of the gate electrodes 130. The conductive material of the gate electrodes 130 may include, for example, a metal, polycrystalline silicon, or a metal silicide material. After the gate electrodes 130 are formed, the separation insulating layer 105 may be formed in the openings formed in the separation regions MS.

Figure 11G:
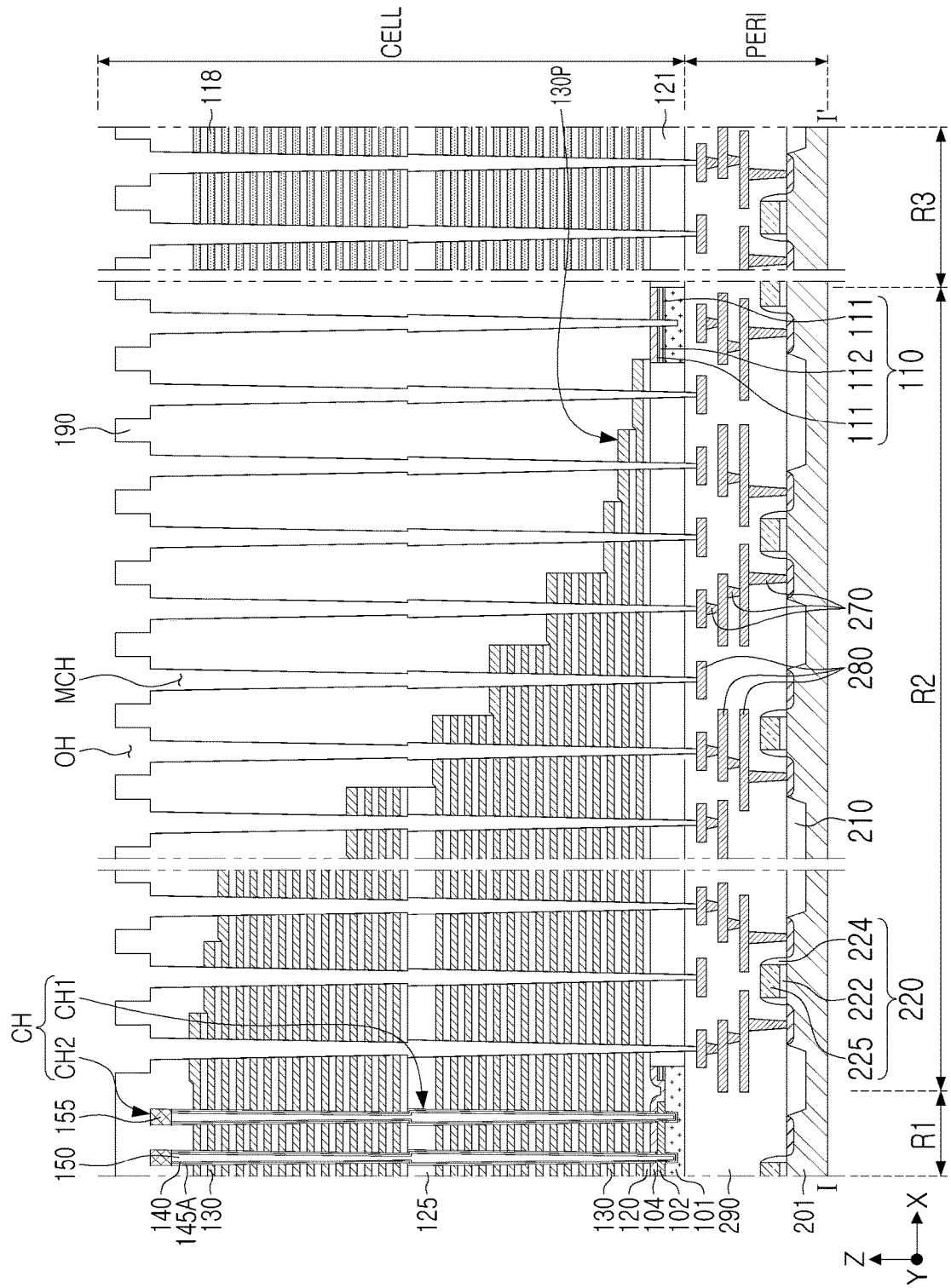

Referring to FIG. 11G, upper openings OH may be formed in the second region R2, and contact holes MCH may be formed by removing the first and second vertical sacrificial layers 116a and 116b.

The upper openings OH may be formed to expose the upper second vertical sacrificial layers 116b by removing the cell region insulating layer 190 and/or other layers, when the other layers are formed during the process, on the second vertical sacrificial layers 116b in the second region R2. Accordingly, the specific shape and depth of the upper openings OH may be varied in example embodiments.

The contact holes MCH may be formed by removing the first and second vertical sacrificial layers 116a and 116b exposed through the upper openings OH.

Figure 11H:
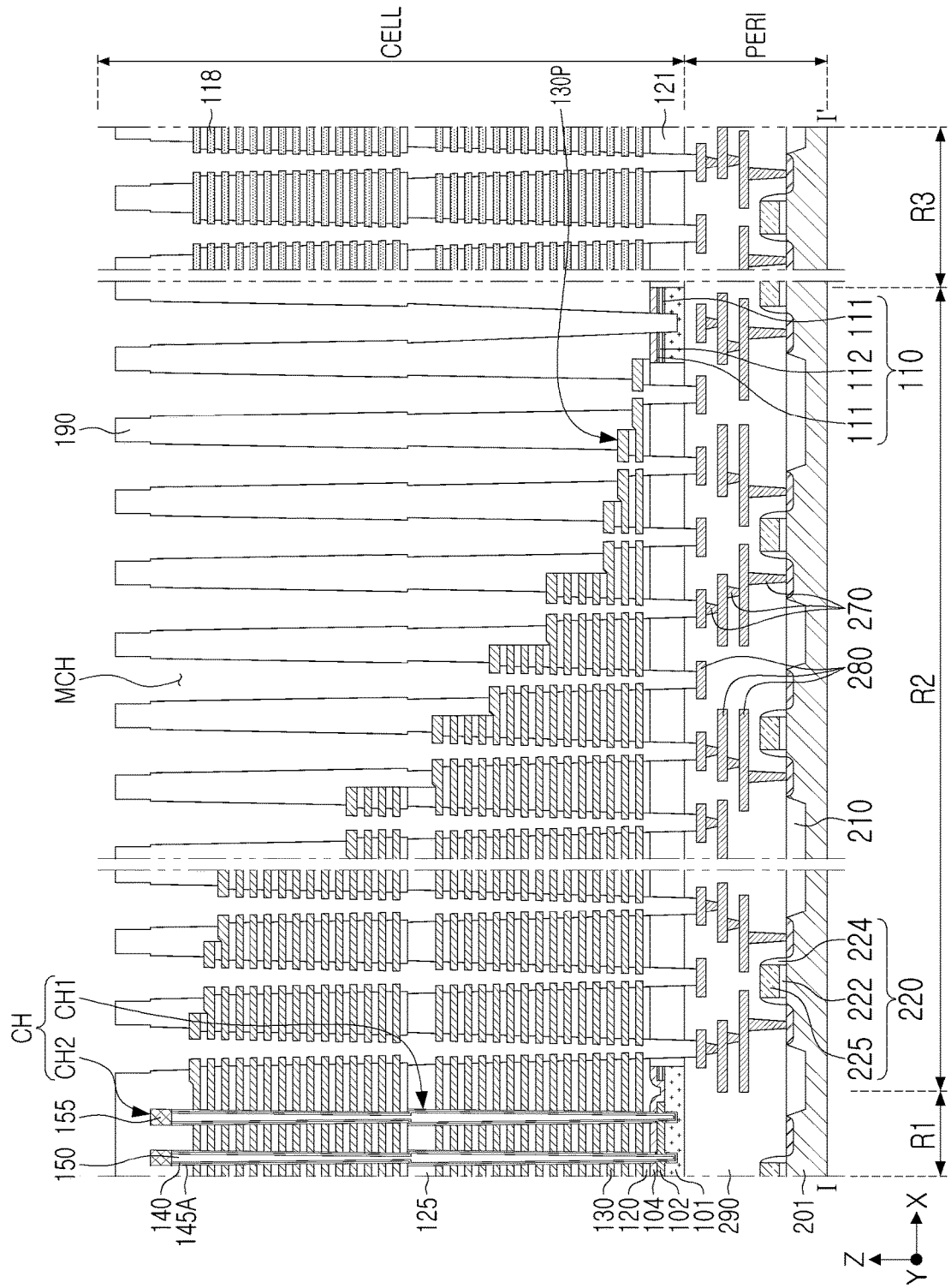

Referring to FIG. 11H, the interlayer insulating layers 120 exposed through the contact holes MCH may be partially removed laterally.

By introducing an etchant through the contact holes MCH, the interlayer insulating layers 120 and the cell region insulating layer 190 exposed through the contact holes MCH around the contact holes MCH may be removed laterally by a predetermined length. Accordingly, the interlayer insulating layers 120 may be recessed below the pad regions 130P such that a structure in which the gate electrodes 130 protrude further than the interlayer insulating layers 120 may be formed.

On the pad regions 130P, the inflow of the etchant may be relatively large, such that the cell region insulating layer 190 may be removed relatively greatly, and the interlayer insulating layers 120 may be removed in a relatively small amount. However, as in the example embodiment in FIG. 5A, the cell region insulating layer 190 and the interlayer insulating layers 120 may be removed by similar lengths.

Figure 11I:
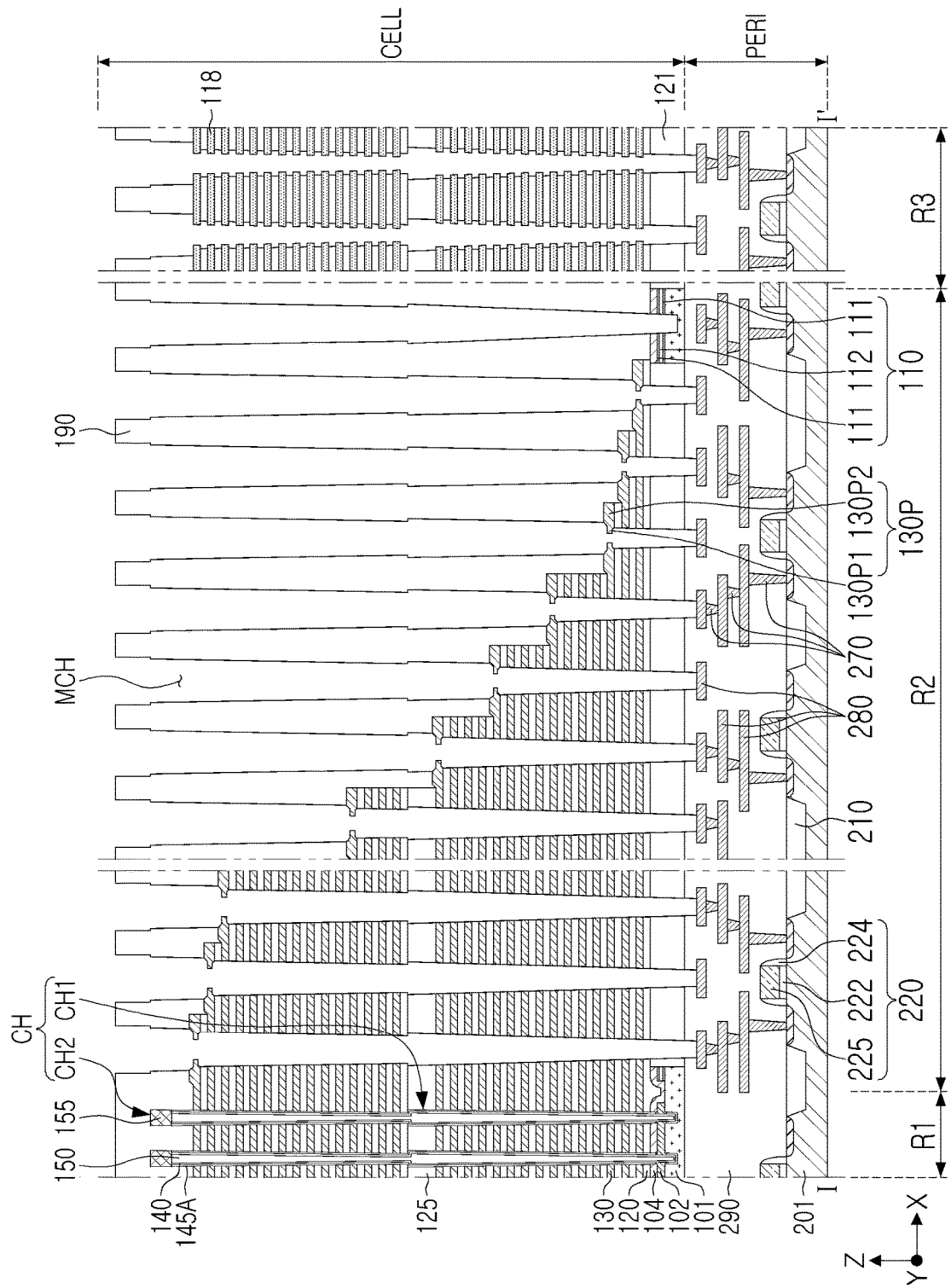

Referring to FIG. 11I, the gate electrodes 130 may be partially removed from the contact holes MCH, thereby forming the first pad portions 130P1 of the pad regions 130P.

Protruding regions of the gate electrodes 130 below the pad regions 130P in the contact holes MCH may be trimmed and removed by an anisotropic etching process by a wet etching process, for example. Meanwhile, in the pad regions 130P having a relatively greater thickness, the gate electrodes 130 may remain and may form the first pad portions 130P1.

The etching process may be performed under the process conditions in which the entire protruding regions of the gate electrodes 130 below the pad regions 130P are removed, and the first pad portions 130P1 remain in the pad regions 130P. Accordingly, in the pad regions 130P, first pad portions 130P1 protruding into the contact holes MCH and having a relatively reduced thickness may be formed, and second pad portions 130P2, the regions other than the first pad portions 130P1, may be defined.

Figure 11J:
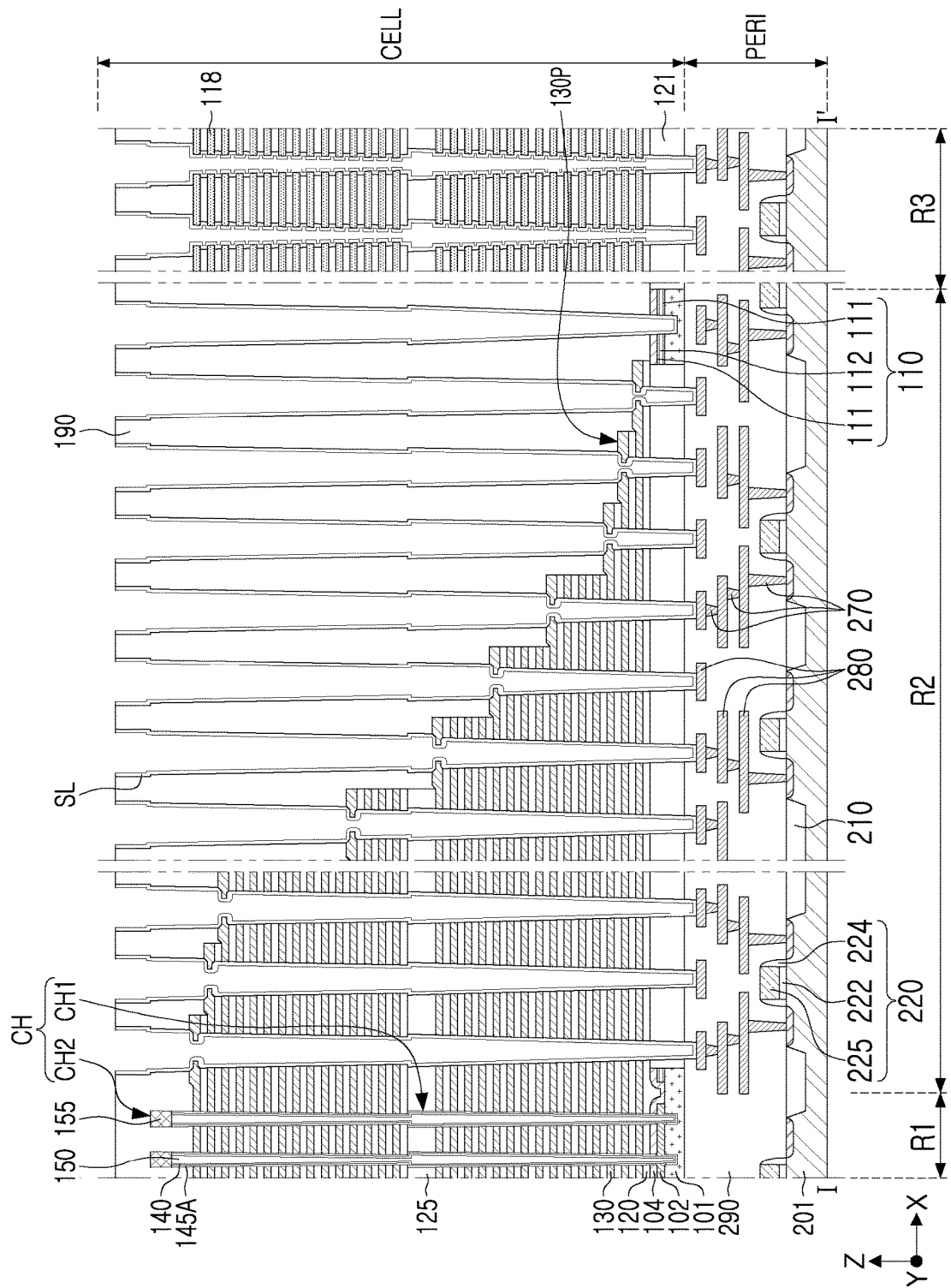

Referring to FIG. 11J, insulating layers SL may be formed along sidewalls of the contact holes MCH.

The insulating layers SL may be provided to form the contact insulating layers 160, the substrate contact insulating layer 165, and the via insulating layers 168 in FIG. 2A. The insulating layers SL may be formed along sidewalls and bottom surfaces of the contact holes MCH by a relatively small thickness using an ALD process, for example. Also, the insulating layers SL may be formed to cover the upper surface, the side surface, and the lower surface of the first pad portions 130P1.

Figure 11K:
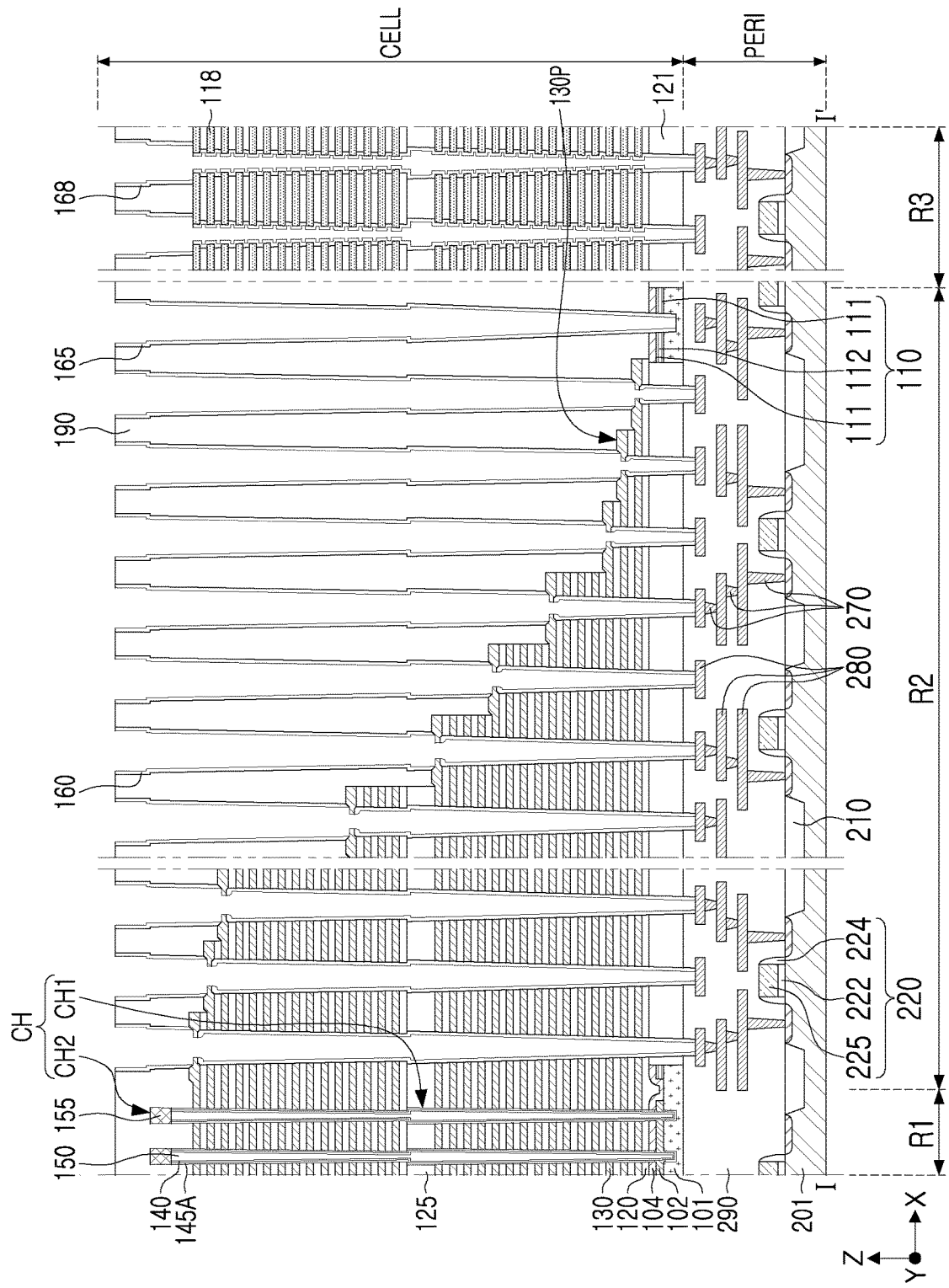

Referring to FIG. 11K, by partially removing the insulating layers SL, the contact insulating layers 160, the substrate contact insulating layer 165, and the via insulating layers 168 may be formed.

The contact insulating layers 160, the substrate contact insulating layer 165, and the via insulating layers 168 may be formed by performing an etch-back process on the insulating layers SL. Accordingly, the insulating layers SL may be removed from the bottom surfaces of the contact holes MCH such that the contact insulating layers 160, the substrate contact insulating layer 165, and the via insulating layers 168 may not be formed on the bottom surfaces. Also, the insulating layers SL may be removed from the upper and side surfaces of the first pad portions 130P1.

Figure 11L:
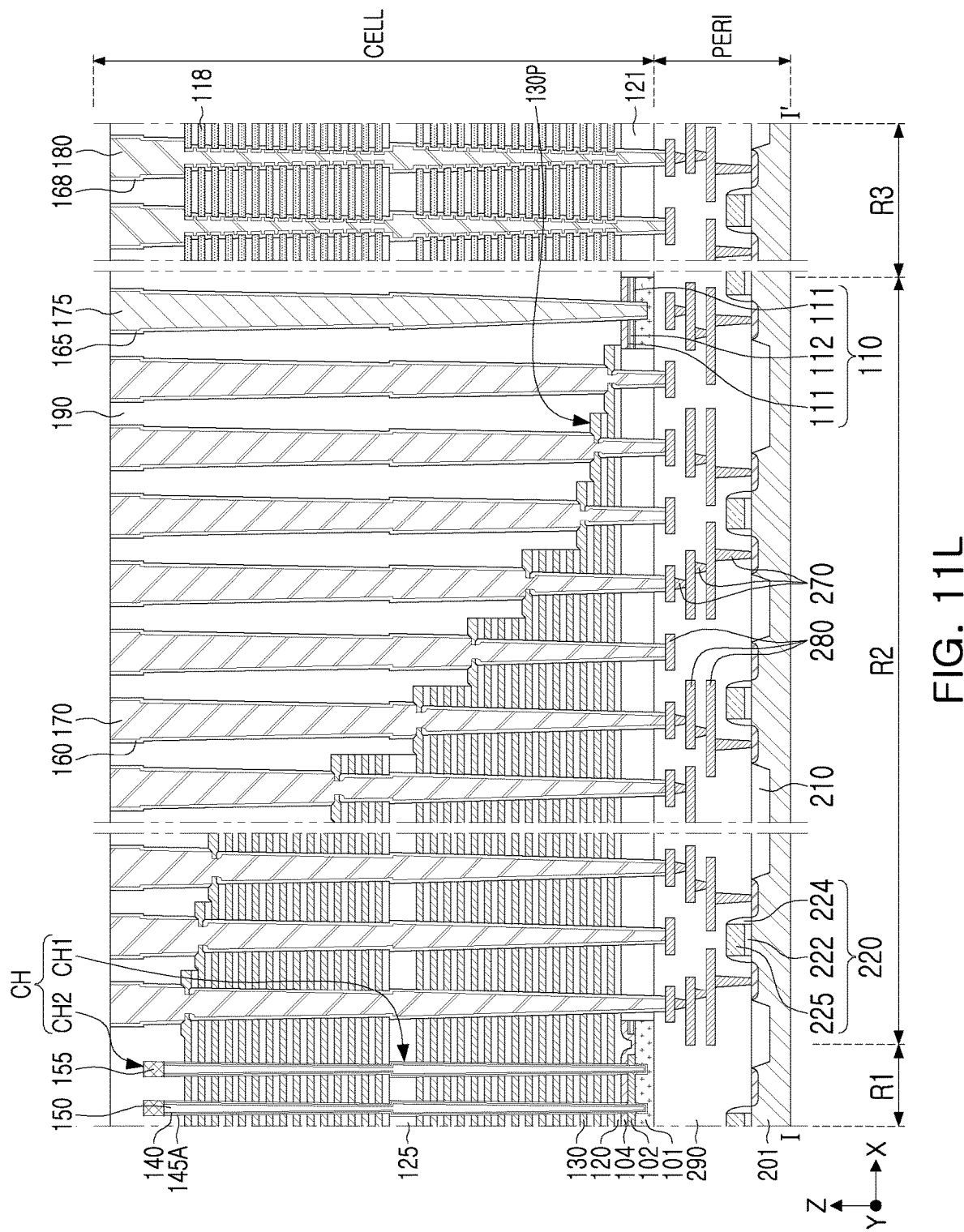

Referring to FIG. 11L, the contact plugs 170, the substrate contact 175, and the through vias 180 may be formed by depositing a conductive material in the contact holes MCH.

As described above with reference to FIGS. 3A and 4, the contact plugs 170, the substrate contact 175, and the through vias 180 may have a structure including a barrier layer. The contact plugs 170, the substrate contact 175, and the through vias 180 may be formed together and may have the same structure. In the example embodiment, the first and second vertical sacrificial layers 116a and 116b may be initially formed, and the contact plugs 170 may be formed by performing the processes in FIGS. 11H to 11L, and thus, the contact plugs 170 may be self-aligned to the gate electrodes 130.

Thereafter, referring back with FIG. 2A, an upper interconnection structure such as the upper interconnections 185 may be further formed on the contact plugs 170, the substrate contact 175, and the through vias 180, thereby manufacturing the semiconductor device 100.

Figure 12:
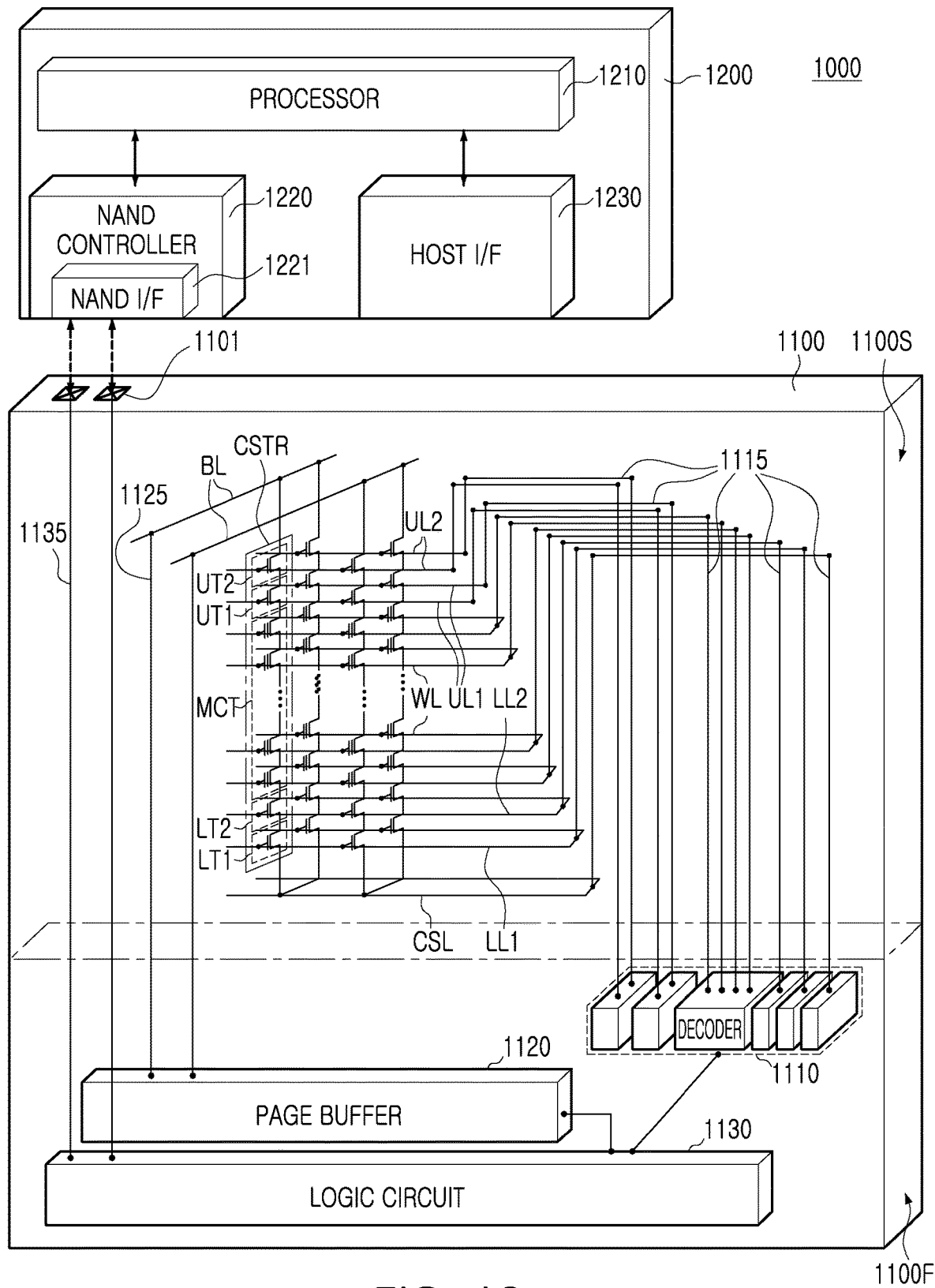
FIG. 12 is a view illustrating a data storage system including a semiconductor device according to an example embodiment of the present disclosure.

FIG. 12 is a view illustrating a data storage system including a semiconductor device according to an example embodiment.

Referring to FIG. 12, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. For example, the data storage system 1000 may be implemented as a solid state drive (SSD) device, a universal serial bus (USB), a computing system, a medical device, or a communication device, including one or a plurality of semiconductor devices 1100.

The semiconductor device 1100 may be implemented as a nonvolatile memory device, and may be implemented as the NAND flash memory device described with reference to FIGS. 1 to 10, for example. The semiconductor device 1100 may include a first semiconductor structure 1100F and a second semiconductor structure 1100S on the first semiconductor structure 1100F. In example embodiments, the first semiconductor structure 1100F may be disposed on the side of the second semiconductor structure 1100S. The first semiconductor structure 1100F may be configured as a peripheral circuit structure including a decoder circuit 1110, a page buffer 1120, and a logic circuit 1130. The second semiconductor structure 1100S may be configured as a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in example embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the first semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 13:
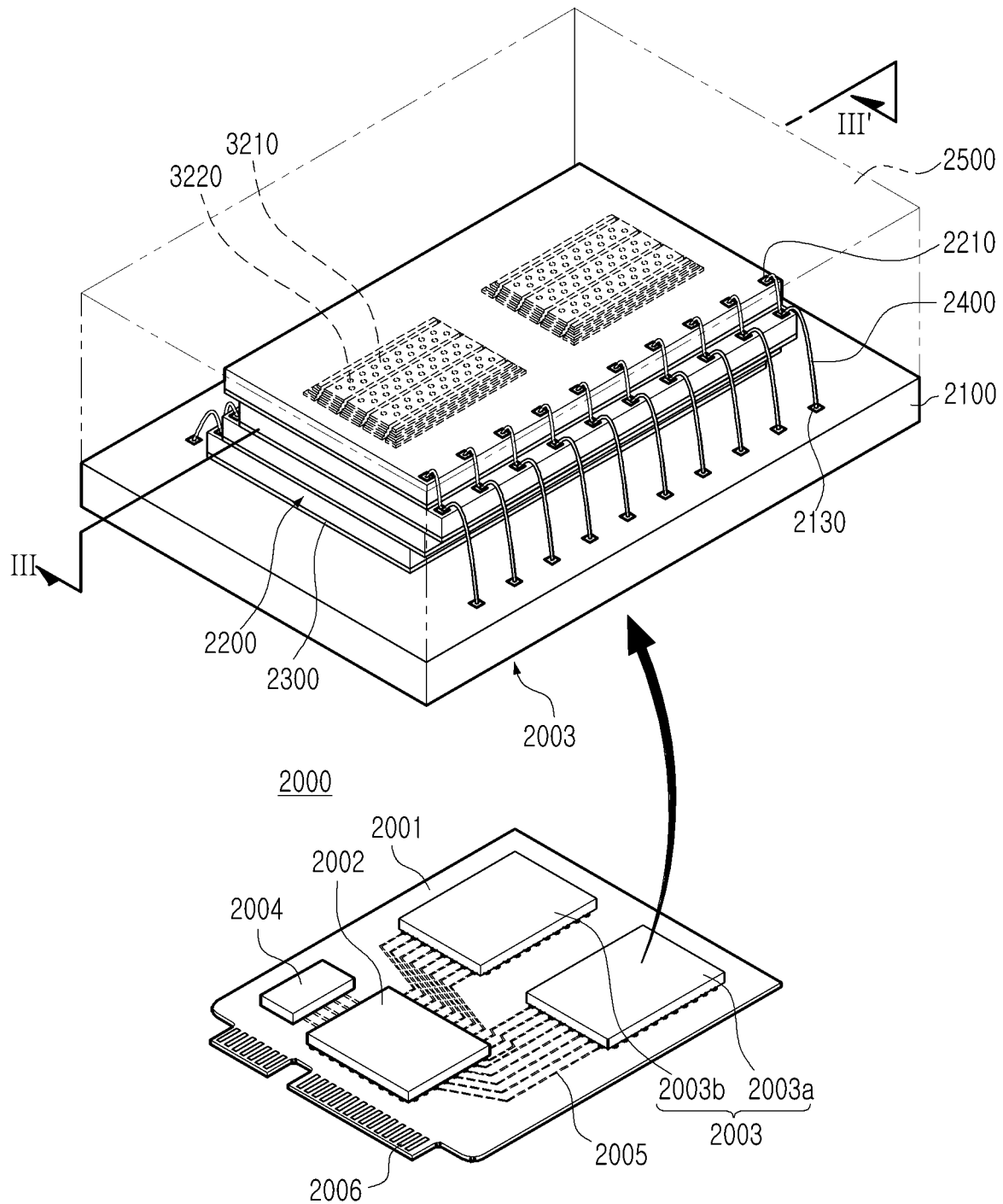
FIG. 13 is a perspective view illustrating a data storage system including a semiconductor device according to an example embodiment of the present disclosure.

FIG. 13 is a perspective view illustrating a data storage system including a semiconductor device according to an example embodiment.

Referring to FIG. 13, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In example embodiments, the data storage system 2000 may communication with the external host through one of a universal serial bus (USB), a peripheral component interconnect express (PCI-Express), a serial advanced technology attachment (SATA), and an M-phy for universal flash storage (UFS). In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 200b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each of the semiconductor chips 2200 may include an input and output pad 2210. The input and output pad 2210 may correspond to the input and output pad 1101 in FIG. 12. Each of the semiconductor chips 2200 may include gate stack structures 3210 and channel structures 3220. Each of the semiconductor chips 2200 may include the semiconductor device described with reference to FIGS. 1 to 10.

In example embodiments, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure a through silicon via (TSV), instead of the connection structure 2400 of a bonding wire.

In example embodiments, the controller 2002 and the semiconductor chips 2200 may be included in a single package. For example, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 14:
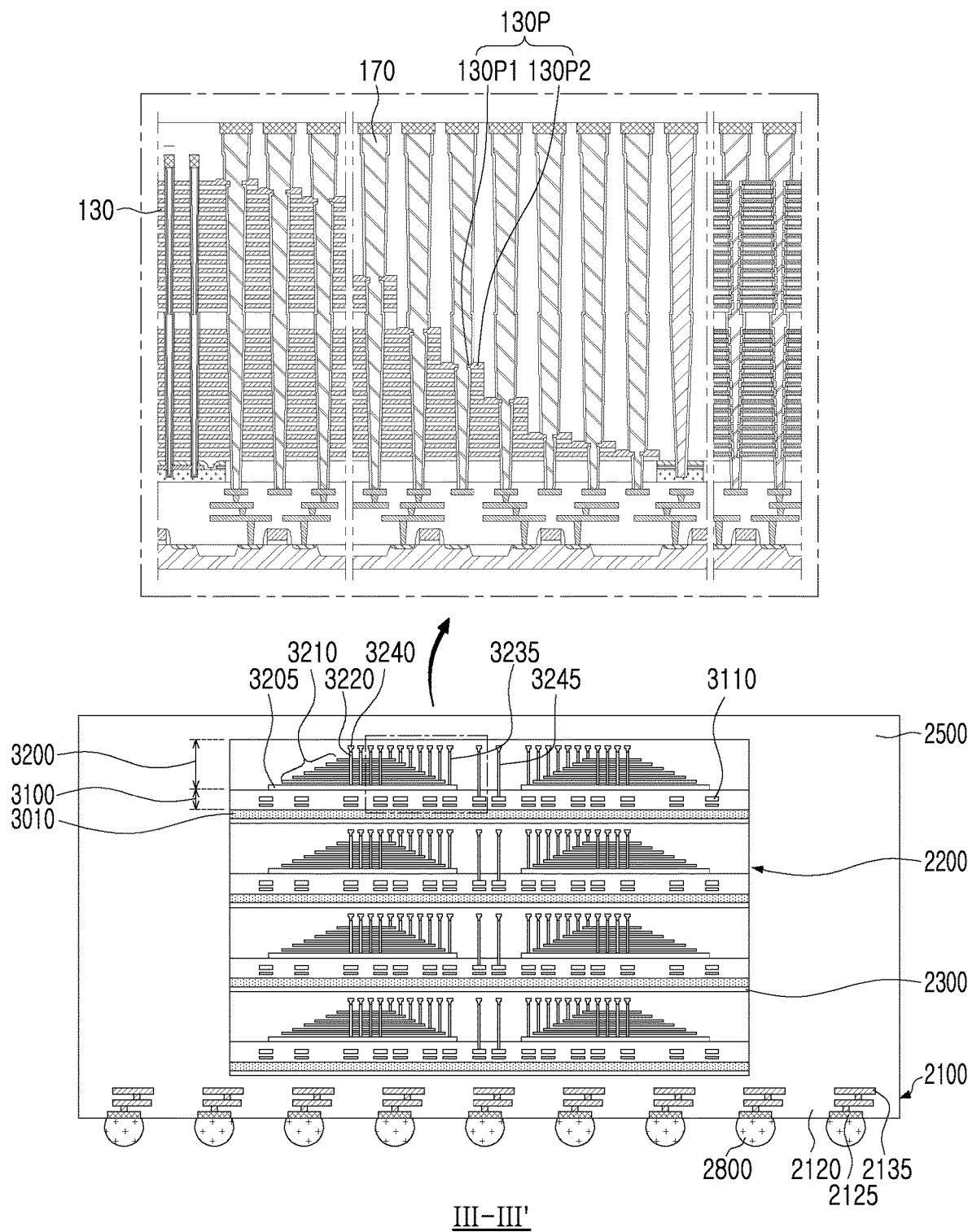
FIG. 14 is a cross-sectional view illustrating a semiconductor package according to an example embodiment of the present disclosure.

FIG. 14 is a cross-sectional view illustrating a semiconductor device according to an example embodiment. FIG. 14 illustrates an example embodiment of the semiconductor package 2003 in FIG. 13, and illustrates the semiconductor package 2003 in FIG. 13 taken along line III-III'.

Referring to FIG. 14, in the semiconductor package 2003, the package substrate 2100 may be configured as a printed circuit board. The package substrate 2100 may include a package substrate body portion 2120, package upper pads 2130 (see FIG. 13) disposed on an upper surface of the package substrate body portion 2120, lower pads 2125 disposed on a lower surface of the package substrate body portion 2120 or exposed through the lower surface, and internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2001 of the data storage system 2000 through conductive connection portions 2800 as in FIG. 13.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and isolation structures penetrating the gate stack structure 3210, bit lines 3240 electrically connected to the memory channel structures 3220, and contact plugs 3235 electrically connected to the word lines WL (see FIG. 12) of the gate stack structure 3210. As described with reference to FIGS. 1 to 10, in each of the semiconductor chips 2200, the contact plugs 170 may be connected to the first pad portions 130P1 of the gate electrodes 130 having protruding side surfaces, may penetrate the gate stack structure 3210, and may extend into the first structure 3100.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be disposed on an external side of the gate stack structure 3210, and may be further disposed to penetrate the gate stack structure 3210. Each of the semiconductor chips 2200 may further include an input and output pad 2210 (see FIG. 13) electrically connected to the peripheral interconnections 3110 of the first semiconductor structure 3100.

According to the aforementioned example embodiments, by configuring the portion of the gate electrode connected to the contact plug to protrude further than the lower gate electrodes in the pad region, a semiconductor device having improved reliability and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
a first semiconductor structure comprising a first substrate, circuit devices on the first substrate, and lower interconnection lines; and
a second semiconductor structure on the first semiconductor structure,
wherein the second semiconductor structure comprises:
a second substrate comprising a first region and a second region;
gate electrodes and interlayer insulating layers alternately stacked in a first direction perpendicular to an upper surface of the second substrate, the gate electrodes extending by different lengths in a second direction on the second region to provide pad regions comprising upper surfaces that are exposed by the interlayer insulating layers;
channel structures penetrating the gate electrodes, extending in the first direction, and each comprising a channel layer, on the first region;
respective contact plugs electrically connected to the pad regions of the gate electrodes, penetrating the gate electrodes, and extending in the first direction; and
contact insulating layers surrounding the respective contact plugs,
wherein the pad regions comprise first and second pad portions, the first pad portions protruding further toward the respective contact plugs than ones of the gate electrodes therebelow to overlap the respective contact plugs in the first direction, and
wherein the gate electrodes have a first thickness on the first region, and the second pad portions have a second thickness greater than the first thickness.

2. The semiconductor device of claim 1, wherein the first pad portions have a third thickness smaller than the second thickness.

3. The semiconductor device of claim 1, wherein the respective contact plugs are in contact with upper surfaces and side surfaces of the first pad portions.

4. The semiconductor device of claim 1, wherein the respective contact plugs have a first width on the pad regions and have a second width smaller than the first width below the pad regions.

5. The semiconductor device of claim 1, wherein the contact insulating layers extend in the first direction between the gate electrodes and the respective contact plugs, and comprise bent portions that protrude toward the respective contact plugs along lower surfaces of the first pad portions.

6. The semiconductor device of claim 1,
wherein the contact insulating layers comprise lower contact insulating layers below the pad regions and upper contact insulating layers on the pad regions, and
wherein the lower contact insulating layers and the upper contact insulating layers are spaced apart from each other.

7. The semiconductor device of claim 1, wherein the second thickness is greater than a maximum gate thickness among the gate electrodes on the first region.

8. The semiconductor device of claim 1,
wherein the second semiconductor structure further comprises gate dielectric layers extending along upper and lower surfaces of the gate electrodes, and
wherein upper surfaces of the first pad portions are exposed by the gate dielectric layers.

9. The semiconductor device of claim 8, wherein side surfaces of the ones of the gate electrodes below the pad regions are in contact with the contact insulating layer without the gate dielectric layers therebetween.

10. The semiconductor device of claim 1, wherein the second semiconductor structure further comprises:
sacrificial insulating layers in contact with the gate electrodes and alternately stacked with the interlayer insulating layers in a region in which the second substrate is not disposed;
a through via penetrating the sacrificial insulating layers and the interlayer insulating layers, extending into the first semiconductor structure, and comprising a same material as the contact plugs; and
a via insulating layer surrounding the through via.

11. The semiconductor device of claim 10, wherein side surfaces of the sacrificial insulating layers protrude further than side surfaces of the interlayer insulating layers toward the through via.

12. The semiconductor device of claim 1, wherein the respective contact plugs extend into the first semiconductor structure.

13. The semiconductor device of claim 1,
wherein the second semiconductor structure further comprises a substrate insulating layer penetrating the second substrate, and
wherein lower ends of the contact plugs are in the substrate insulating layer.

14. The semiconductor device of claim 1, wherein the second semiconductor structure further comprises:
a first horizontal conductive layer below the gate electrodes on the first region;
a horizontal insulating layer below the gate electrodes on the second region; and
a second horizontal conductive layer on the first horizontal conductive layer and the horizontal insulating layer.

15. A semiconductor device, comprising:
a substrate comprising a first region and a second region;
gate electrodes stacked and spaced apart from each other in a first direction perpendicular to an upper surface of the substrate, and extending by different lengths in a second direction on the second region to provide pad regions comprising upper surfaces that are exposed;
channel structures penetrating the gate electrodes, extending in the first direction, and each comprising a channel layer, on the first region;
respective contact plugs penetrating the pad regions of the gate electrodes and extending in the first direction; and
contact insulating layers surrounding the respective contact plugs,
wherein the gate electrodes comprise side surfaces protruding further toward the respective contact plugs in the pad regions than ones of the gate electrodes therebelow.

16. The semiconductor device of claim 15,
wherein the pad regions comprise first pad portions having the protruding side surfaces and upper surfaces in contact with the contact plugs, and second pad portions surrounding the first pad portions, and
wherein the first pad portions have a first thickness, and the second pad portions have a second thickness greater than the first thickness.

17. The semiconductor device of claim 16, further comprising:
gate dielectric layers extending along upper surfaces and lower surfaces of the gate electrodes,
wherein the gate dielectric layers extend to upper surfaces and lower surfaces of the second pad portions, and
wherein upper surfaces and lower surfaces of the first pad portions are free of the gate dielectric layers.

18. The semiconductor device of claim 15, wherein the gate electrodes below the pad regions are spaced apart from the contact plugs by the contact insulating layers.

19. A data storage system, comprising:
a semiconductor storage device comprising a substrate comprising a first region and a second region, circuit devices on one side of the substrate, and input/output pads electrically connected to the circuit devices; and
a controller electrically connected to the semiconductor storage device through the input/output pad and configured to control the semiconductor storage device,
wherein the semiconductor storage device comprises:
gate electrodes stacked and spaced apart from each other in a first direction perpendicular to an upper surface of the substrate, and extending by different lengths in a second direction on the second region to provide pad regions comprising upper surfaces that are exposed;
channel structures penetrating the gate electrodes, extending in the first direction, and each comprising a channel layer, on the first region;
respective contact plugs penetrating the pad regions of the gate electrodes and extending in the first direction; and
contact insulating layers surrounding the contact plugs,
wherein the gate electrodes comprise side surfaces protruding further toward the respective contact plugs in the pad regions than ones of the gate electrodes therebelow.

20. The data storage system of claim 19,
wherein the gate electrodes comprise first pad portions having the protruding side surfaces and overlapping the respective contact plugs in the first direction, and second pad portions surrounding the first pad portions, and
wherein the gate electrodes have a first thickness on the first region, a second thickness greater than the first thickness in the second pad portions, and a third thickness smaller than the second thickness in the first pad portions.

* * * * *